(12) United States Patent
Narita

(10) Patent No.: US 11,004,936 B2
(45) Date of Patent: May 11, 2021

(54) SILICON CARBIDE INSULATED-GATE POWER FIELD EFFECT TRANSISTOR

(71) Applicant: FUJI ELECTRIC CO., LTD., Kawasaki (JP)

(72) Inventor: Syunki Narita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 60 days.

(21) Appl. No.: 16/397,380

(22) Filed: Apr. 29, 2019

(65) Prior Publication Data

US 2019/0371889 A1    Dec. 5, 2019

(30) Foreign Application Priority Data

Jun. 1, 2018    (JP) .............................. JP2018-106459

(51) Int. Cl.
  *H01L 29/08*    (2006.01)
  *H01L 29/78*    (2006.01)
  (Continued)

(52) U.S. Cl.
  CPC ........ *H01L 29/0865* (2013.01); *H01L 29/045* (2013.01); *H01L 29/0623* (2013.01);
  (Continued)

(58) Field of Classification Search
  CPC ............. H01L 29/0623; H01L 29/0696; H01L 29/1037; H01L 29/1608; H01L 29/4236;
  (Continued)

(56) References Cited

U.S. PATENT DOCUMENTS 5,168,331 A * 12/1992 Yilmaz ............... H01L 29/0623
                                                                 257/331
5,744,826 A    4/1998 Takeuchi et al.
(Continued)

FOREIGN PATENT DOCUMENTS

JP    10-290010 A    10/1998
JP    5673393 B2    2/2015
(Continued)

OTHER PUBLICATIONS

H. Matsunami "Semiconductor SiC technology and application", 2nd edition, Nikkan Kogyo Shimbun, 2011, pp. 368-369 (Discussed in Patent Application Specification and accompanied by concise statement of relevance).

*Primary Examiner* — Marcos D. Pizarro

(57) ABSTRACT

Insulated gate semiconductor device includes drift layer of first conductivity type; first base region of second conductivity type on the drift layer; carrier-supply region of the first conductivity type on the first base region and having higher impurity concentration than the drift layer; a first contact region of the second conductivity type on the first base region and having higher impurity concentration than the first base regions; cell-pillars each having polygonal-shape, arranged in a lattice-pattern, sidewalls of the cell-pillars are defined by trenches penetrating the carrier-supply region, the first contact region, and the first base region; and insulated-gate electrode-structures in the trenches. A first pillar selected from the cell-pillars includes the carrier-supply region, the first contact region and the first base (Continued)

region, and the first contact regions are in contact with a limited portion of an outer periphery of a first pillar at a top surface of the first pillar.

20 Claims, 21 Drawing Sheets

(51) Int. Cl.
  *H01L 29/739* (2006.01)
  *H01L 29/06* (2006.01)
  *H01L 29/66* (2006.01)
  *H01L 29/423* (2006.01)
  *H01L 29/10* (2006.01)
  *H01L 29/04* (2006.01)
  *H01L 29/16* (2006.01)
  *H01L 29/417* (2006.01)

(52) U.S. Cl.
  CPC ...... *H01L 29/0696* (2013.01); *H01L 29/0869* (2013.01); *H01L 29/1037* (2013.01); *H01L 29/1095* (2013.01); *H01L 29/1608* (2013.01); *H01L 29/41741* (2013.01); *H01L 29/4236* (2013.01); *H01L 29/4238* (2013.01); *H01L 29/66068* (2013.01); *H01L 29/66348* (2013.01); *H01L 29/66734* (2013.01); *H01L 29/7397* (2013.01); *H01L 29/7813* (2013.01)

(58) Field of Classification Search
  CPC ............ H01L 29/4238; H01L 29/6608; H01L 29/7813
  See application file for complete search history.

(56) References Cited

U.S. PATENT DOCUMENTS

| | | |
|---|---|---|
| 6,133,587 A | 10/2000 | Takeuchi et al. |
| 7,091,555 B2 * | 8/2006 | Yoshimochi ........ H01L 29/7813 257/330 |
| 9,136,372 B2 | 9/2015 | Miyahara et al. |
| 9,224,860 B2 | 12/2015 | Kagawa et al. |
| 9,614,029 B2 | 4/2017 | Kagawa et al. |
| 9,698,220 B2 | 7/2017 | Hirakata |
| 9,741,797 B2 | 8/2017 | Kagawa et al. |
| 9,960,235 B2 | 5/2018 | Hoshi et al. |
| 9,985,093 B2 | 5/2018 | Kagawa et al. |
| 10,157,986 B2 * | 12/2018 | Tanaka ................ H01L 21/0465 |
| 2013/0001592 A1 | 1/2013 | Miyahara et al. |
| 2013/0285140 A1 | 10/2013 | Kagawa et al. |
| 2015/0357415 A1 | 12/2015 | Kagawa et al. |
| 2016/0071922 A1 | 3/2016 | Kagawa et al. |
| 2016/0308003 A1 | 10/2016 | Hirakata |
| 2017/0018609 A1 | 1/2017 | Hoshi et al. |
| 2017/0162649 A1 | 6/2017 | Kagawa et al. |
| 2017/0309711 A1 | 10/2017 | Kagawa et al. |

FOREIGN PATENT DOCUMENTS

| | | |
|---|---|---|
| JP | 5710644 B2 | 4/2015 |
| JP | 2015-99845 A | 5/2015 |
| JP | 2016-039070 A1 | 3/2016 |
| JP | 6177812 B2 | 8/2017 |

* cited by examiner

FIG. 15A
FIG. 15B
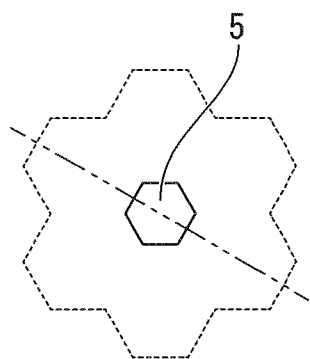
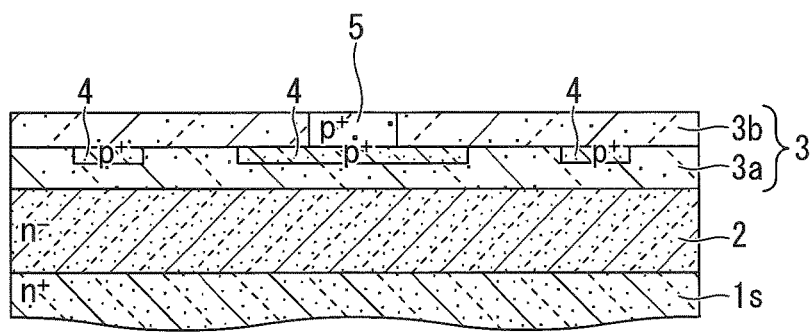
FIG. 16A
FIG. 16B
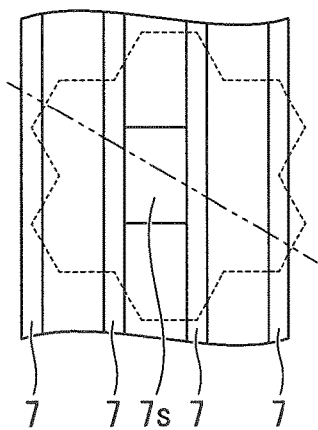
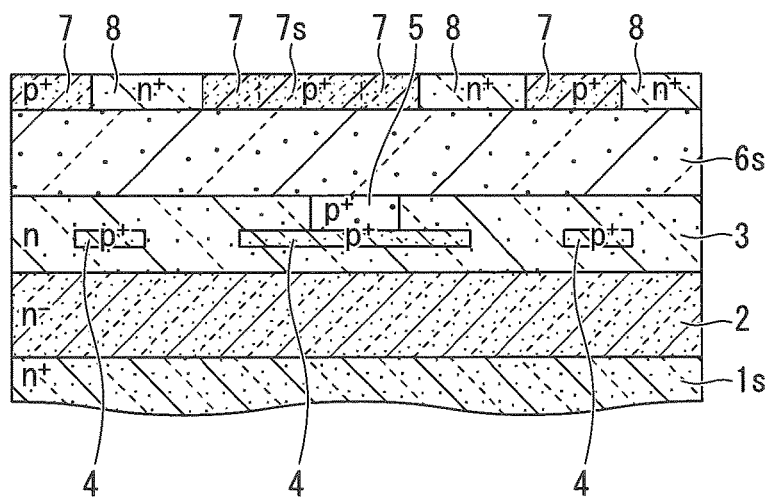

FIG. 17A
FIG. 17B
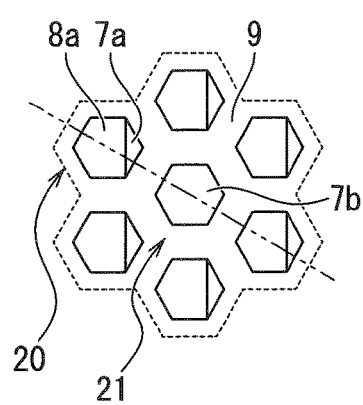
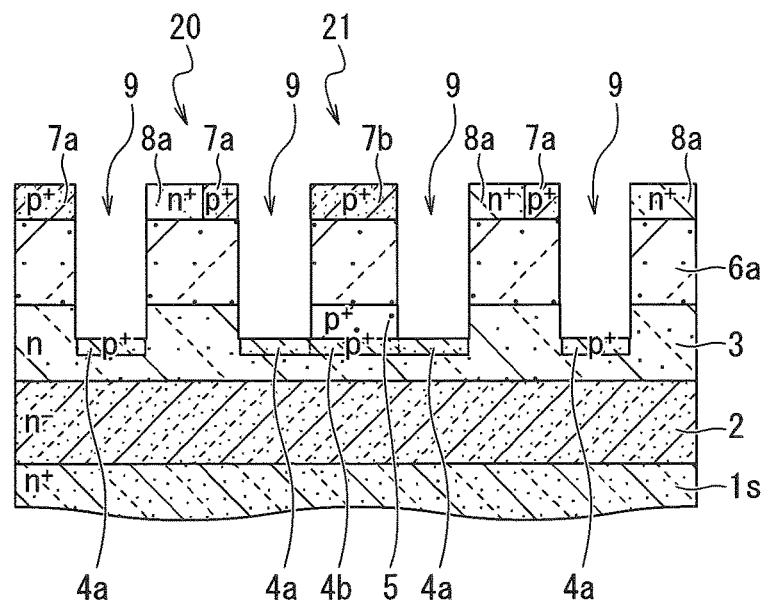
FIG. 18A
FIG. 18B
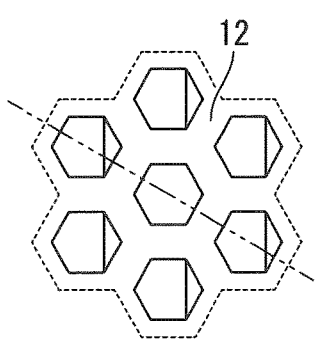
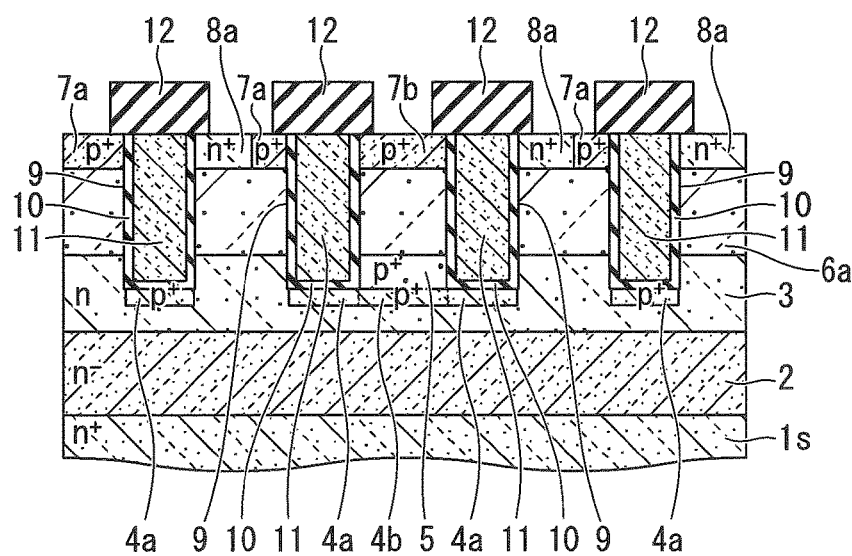

FIG. 19A
FIG. 19B
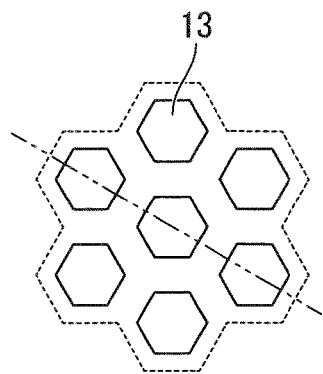
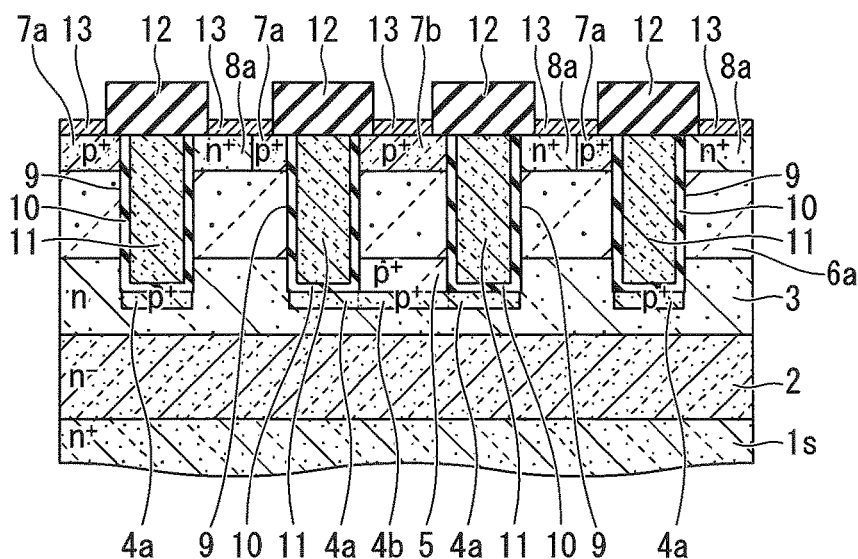
FIG. 20
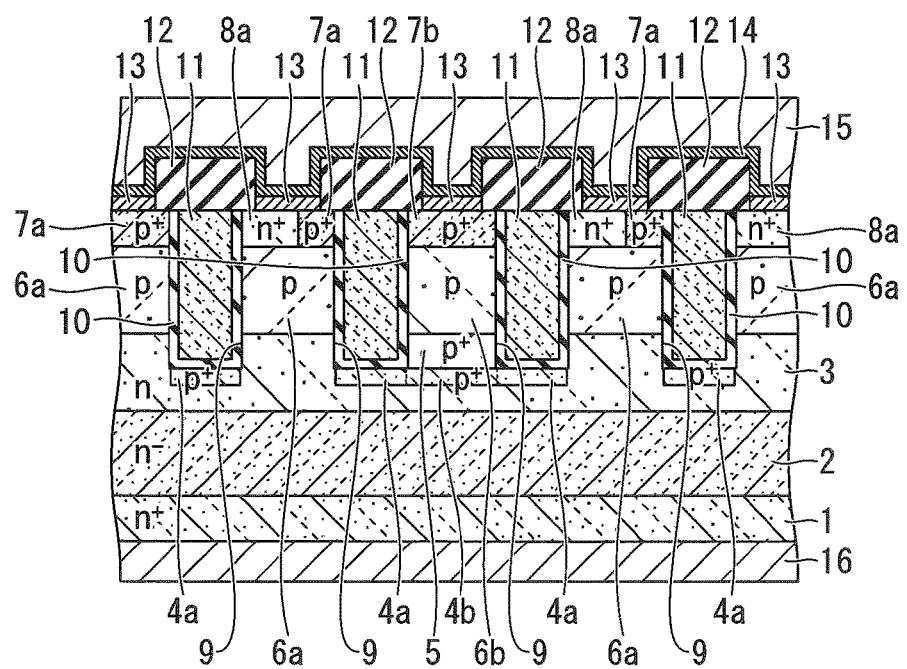

SILICON CARBIDE INSULATED-GATE POWER FIELD EFFECT TRANSISTOR

CROSS REFERENCE TO RELATED APPLICATIONS

This application is based upon and claims the benefit of priority from the prior Japanese Patent Application No. P2018-106459 filed on Jun. 1, 2018, the entire contents of which are incorporated herein by reference.

BACKGROUND OF THE INVENTION

1. Field of the Invention

The present invention relates to an insulated gate semiconductor device and a method for manufacturing the insulated gate semiconductor device, and more particularly to an insulated gate semiconductor device having a trench gate structure and a method for manufacturing the same.

In power semiconductor devices using silicon (Si), improvements are being made to meet the demand for large current and high speed, but at the present time it has reached the material limit. Therefore, a wide bandgap semiconductor of silicon carbide (SiC), which has excellent characteristics, such as low on-resistance, high-speed characteristics, high breakdown voltage, low loss, high temperature characteristics and the like, has attracted attention as an alternative semiconductor material for Si. In order to take advantage of the characteristics of SiC, a configuration of a cell of a metal-oxide-semiconductor field-effect transistor (MOSFET) and a structure for limiting a region of channel have been proposed.

For example, in JP 2015-99845 A, a planar cell shape of hexagon, which includes a set of long sides, is proposed so as to reduce the contact resistance, by securing an area of the contact region disposed in the source region. In JP 2016-039070 A1, in a base region having a polygonal-shape or a stripe-shape, the carrier-supply region are arranged in an island-shape to reduce the resistance of the base region and to improve the breakdown tolerance. In JP 2015-99845 A and JP 2016-039070 A1, a planar gate MOSFET in which a channel region is formed in parallel to the surface of the semiconductor layer is used. In the planar gate structure, it is difficult to reduce the cell pitch, because the junction field-effect transistor (JFET) effect will narrow the current path by depletion layers extending from the adjacent channel regions.

In a trench gate MOSFET, a channel region is formed on side-faces of trenches formed in a semiconductor layer. In the trench gate MOSFET, since the channel density can be increased by reducing the cell pitch as compared with the planar MOSFET, the on-resistance can be reduced and low loss can be expected.

For example, in JP H10-290010 A, a plurality of source region is provided in island-like semiconductor regions having a polygon-shape, and an insulating film is formed on sidewalls of trenches surrounding the island-like semiconductor regions to obtain a highly reliable gate insulating film JP 5673393 B discloses a method in which channel regions are formed on sidewalls having higher mobility among sidewalls of trenches formed in a semiconductor layer on an off-angle substrate and any channel is not provided on sidewalls having lower mobility, so as to prevent an increase in on-resistance.

In the trench gate structure of JP H10-290010 A and JP 5673393 B, there is a concern that dielectric breakdown may occur due to applying a high electric field to the gate insulating film at the bottom of the trench. On the other hand, in JP 6177812 B, a p-type protection region is provided at the bottom of the trench and a p-type semiconductor region, which may fix the potential of the protection region, is formed on the trench sidewall so as to prevent dielectric breakdown of the gate insulating film by reducing the electric field. In JP 5710644 B, the p-type protection region is arranged in a lattice-pattern at the bottom of a trench to reduce the electric field concentration at the bottom of the gate insulating film. Further, in JP 5710644 B, as a contact region for connecting one of the cells divided by the gate electrode to the protection region, the area of the contact region is secured to reduce the resistance to the protection region.

In the earlier MOSFET, the protection regions are provided at the bottoms of the trenches to prevent dielectric breakdown of the gate insulating film. Furthermore, the p-type buried regions are also provided in the lower part of the source region in order to reduce the electric field concentration at the end of the protected regions. In such case, the n-type drift region is sandwiched between the protection regions of the trench bottoms and the buried regions under the source region, and a parasitic resistance due to the JFET effect may occur. In order to prevent the increase in on-resistance due to parasitic resistance, it is necessary to secure a width, that is, a JFET width, of the drift region sandwiched between the protection regions and the buried regions at a certain level or more. Thus, it is difficult to reduce the cell pitch.

SUMMARY OF THE INVENTION

An aspect of the present invention inheres in an insulated gate semiconductor device, including: (a) a drift layer of a first conductivity type; (b) a plurality of first base regions of a second conductivity type disposed on the drift layer; (c) a plurality of carrier-supply regions of the first conductivity type provided on the first base regions and having a higher impurity concentration than the drift layer; (d) a plurality of first contact regions of the second conductivity type provided on the first base regions and having a higher impurity concentration than the first base regions; (e) a plurality of cell-pillars each having a polygonal-shape, arranged in a lattice-pattern, sidewalls of the cell-pillars are defined by a trench penetrating the carrier-supply regions, the first contact regions, and the first base regions; and (f) an insulated-gate electrode-structure provided in the trench, wherein each of first pillars selected from the cell-pillars includes each one of the carrier-supply regions, the first contact regions and the first base regions, and each of the first contact regions is in contact with a limited portion of an outer periphery of a corresponding first pillar at a top surface of the corresponding first pillar.

Another aspect of the present invention inheres in a method for manufacturing an insulated gate semiconductor device, the method encompassing: (a) growing a base region on a top surface of a drift layer of a first conductivity type, the base region having a second conductivity type; (b) selectively forming a plurality of carrier-supply regions of the first conductivity type having a higher impurity concentration than the drift layer in an upper portion of the base region; (c) selectively forming a first contact region of the second conductivity type having a higher impurity concentration than the base region in a selected upper portion of the base region; (d) digging a trench penetrating each of the carrier-supply regions, the first contact regions, and a portion of the base regions being disposed under the carrier-supply regions to define a plurality polygonal cell-pillars arranged in a lattice-pattern; and (e) forming an insulated-gate electrode-structure having a gate insulating film and a gate electrode on an inside of the trench, wherein each of first pillars is assigned from the cell-pillars to include each one of the carrier-supply regions, the first contact regions, and the portion of the base regions being disposed under the carrier-supply regions, and, in each of the first pillars, a corresponding first contact region is allocated to be contacted with a limited portion of an outer periphery of a corresponding first pillar at a top surface of the corresponding first pillar.

BRIEF DESCRIPTION OF THE DRAWINGS

FIGS. 15A and 15B are a schematic top view and a schematic cross-sectional view illustrating an example of a process subsequent to FIGS. 14A and 14B in the manufacturing method of the insulated gate semiconductor device according to the embodiment;

FIGS. 16A and 16B are a schematic top view and a schematic cross-sectional view illustrating an example of a process subsequent to FIGS. 15A and 15B in the manufacturing method of the insulated gate semiconductor device according to the embodiment;

FIGS. 17A and 17B are a schematic top view and a schematic cross-sectional view illustrating an example of a process subsequent to FIGS. 16A and 16B in the manufacturing method of the insulated gate semiconductor device according to the embodiment;

FIGS. 18A and 18B are a schematic top view and a schematic cross-sectional view illustrating an example of a process subsequent to FIGS. 17A and 17B in the manufacturing method of the insulated gate semiconductor device according to the embodiment;

FIGS. 19A and 19B are a schematic top view and a schematic cross-sectional view illustrating an example of a process subsequent to FIGS. 18A and 18B in the manufacturing method of the insulated gate semiconductor device according to the embodiment;

FIG. 20 is a schematic cross-sectional view illustrating an example of a process subsequent to FIG. 19B in the manufacturing method of the insulated gate semiconductor device according to the embodiment;

DETAILED DESCRIPTION

Figure 1:
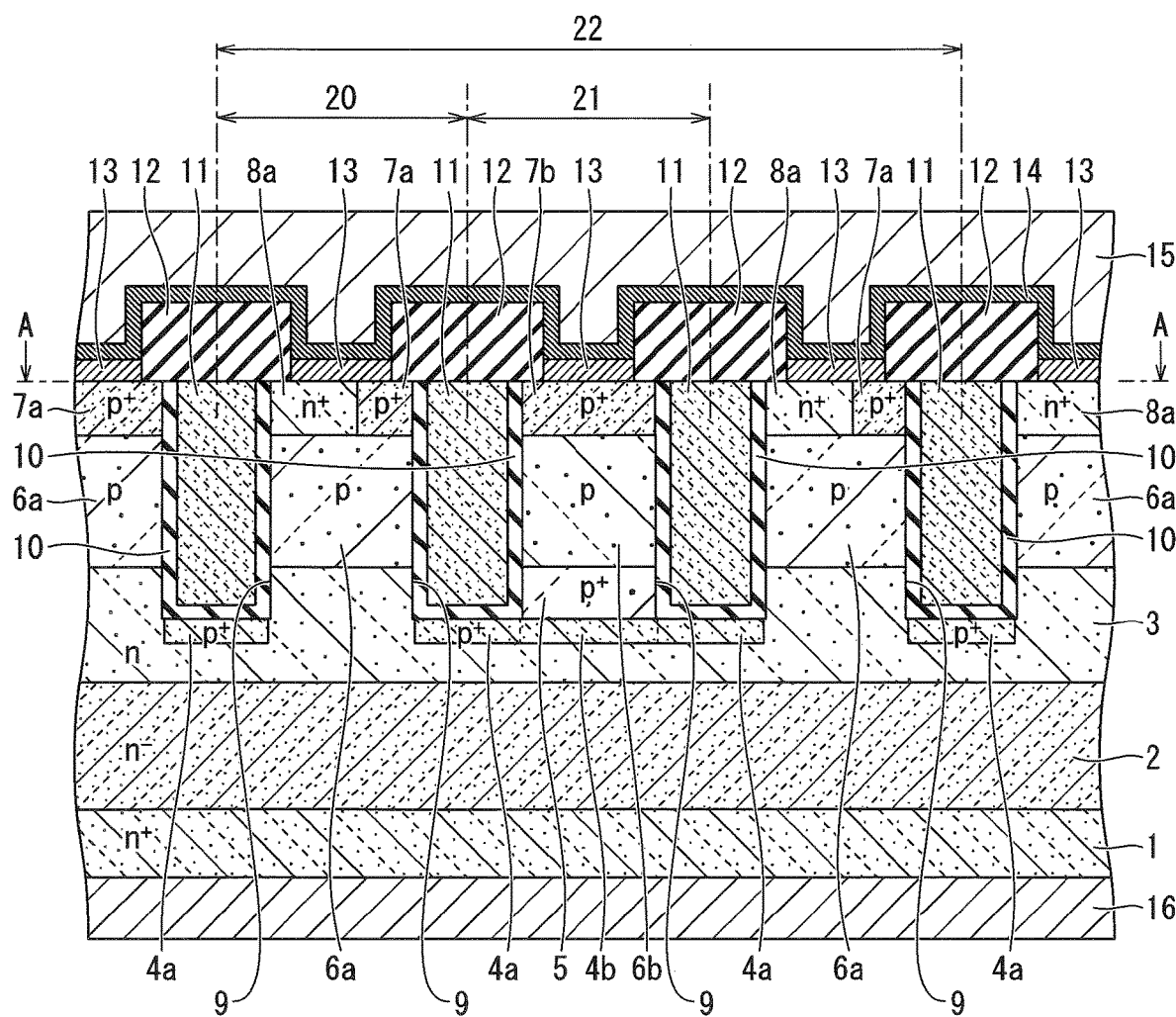
FIG. 1 is a schematic cross-sectional view illustrating an example of an insulated gate semiconductor device according to an embodiment of the present invention.

Exemplary embodiments of the present invention will be described below with reference to the drawings. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

In the present specification, a "carrier-supply region" is assigned as a source region in a metal-insulator-semiconductor field-effect transistor (MISFET) or a metal-insulator-semiconductor static-induction transistor (MISSIT). In an insulated gate bipolar transistor (IGBT), the carrier-supply region is assigned as an emitter region. Further, in a MIS composite thyristor such as a MIS controlled static-induction thyristor (SI thyristor), the carrier-supply region is assigned as a cathode region. A "carrier-extract region" is assigned as the drain region in the MISFET or MISSIT, a collector region in the IGBT, and an anode region in the MIS composite thyristor.

In the following descriptions, the case where a first conductivity type is n-type and a second conductivity type is p-type will be exemplarily described. However, it is also possible to select the conductivity type in an inverse relationship so that the first conductivity type is p-type and the second conductivity type is n-type. In addition, the superscript "+" or "−" added to the mark "n" or "p" denotes that a semiconductor region has relatively high or low impurity concentration as compared with a region without the superscript "+" or "−" added. Further, in the following explanation, it is technically and logically obvious that a constituent member, component or a semiconductor region to which a limitation of a "first conductivity type" or a "second conductivity type" is added means a constituent member, component or a semiconductor region made of a semiconductor material without particular limitation. In addition, in the specification, "−" in the Miller index notation denotes a bar on top of the following Miller index, and a negative index is denoted with adding "−" before the index.

Further, in the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left".

<Structure>

As illustrated in FIG. 1, an insulated gate semiconductor device according to an embodiment of the present invention is a trench gate MISFET including a first conductivity type (n⁻-type) drift layer 2, a second conductivity type (p-type) first base regions 6a and a p-type second base regions 6b. Each of the drift layer 2, the first base regions 6a and the second base regions 6b is based on a hexagonal semiconductor crystal including other semiconductor regions, such as carrier-supply regions 8a, described below. The first base regions 6a and the second base regions 6b are regions for controlling injection of carriers injected into the drift layer 2. The drift layer 2 is a region in which carriers injected from the first base regions 6a and the second base regions 6b are transported with a drift electric field. An n-type current spreading layer 3 having a higher impurity concentration than the drift layer 2 is provided between the drift layer 2, the first base regions 6a and the second base regions 6b. The current spreading layer 3 has a function to reduce spreading resistance for the carriers injected into the drift layer 2. In the absence of the current spreading layer 3, a top surface of the drift layer 2 may be in contact with the first base regions 6a and the second base regions 6b at the position of the top surface of the current spreading layer 3 illustrated in FIG. 1.

The n⁺-type carrier-supply regions 8a having a higher impurity concentration than the drift layer 2 are provided on the first base region 6a. p⁺-type first contact regions 7a having a higher impurity concentration than the first base regions 6a and the second base regions 6b are provided on the first base region 6a so as to be in contact with the carrier-supply regions 8a. p⁺-type second contact region 7b having a higher impurity concentration than the first base regions 6a and the second base regions 6b are provided on the second base region 6b. A trench 9 is provided so as to be in contact with the carrier-supply regions 8a, the first contact regions 7a and the second contact regions 7b, to penetrate the first base regions 6a and the second base regions 6b and to reach the current spreading layer 3. A gate electrode 11 is buried via a gate insulating film 10 provided on a bottom surface and a sidewall in inside of the trench 9 which penetrates the hexagonal semiconductor crystal layer, thereby forming an insulated-gate electrode-structure (10, 11).

For the gate insulating film 10, in addition to a silicon oxide ($SiO_2$) film, a dielectric film, such as a silicon oxynitride (SiON) film, a strontium oxide (SrO) film, a silicon nitride ($Si_3N_4$) film, an aluminum oxide ($Al_2O_3$) and the like, may be adopted. Also, a dielectric film, such as a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) and the like, may be used. Moreover, a single-layer film of any one of the above-mentioned dielectric films or a composite film in which the plural dielectric films are laminated, may be used. For a material of the gate electrode 11, for example, a polysilicon layer doped with impurities, such as phosphorus (P) and the like, at a high concentration, that is, a doped polysilicon layer, can be used.

A first-main electrode 15 is disposed on the gate electrode 10 via an interlayer insulating film 12. For the interlayer insulating film 12, a non-doped silicon oxide ($SiO_2$) film called "NSG", in which phosphorus (P) or boron (B) is not contained, can be adopted. However, for the interlayer insulating film 12, a silicon oxide film to which phosphorus atoms are contained, that is PSG, a silicon oxide film to which boron atoms are contained, that is BSG, a silicon oxide film to which boron and phosphorus are atoms are contained, that is BPSG, a silicon nitride ($Si_3N_4$) film and the like, may be adopted.

Contact-improving layers 13 are provided to physically contact with the carrier-supply regions 8a exposed at windows in the interlayer insulating film 12. The contact-improving layers 13 are further physically contacted with the first contact regions 7a and the second contact regions 7b, which are exposed at windows in the interlayer insulating film 12. A barrier-metal layer 14 is provided so as to cover the interlayer insulating film 12 and the contact-improving layers 13. A first-main electrode 15 is electrically connected to the carrier-supply regions 8a and the first contact region 7a and the second contact region 7b via the barrier-metal layer 14 and the contact-improving layer 13. For example, the contact-improving layer 13 may be made of a nickel silicide ($NiSi_x$) film, the barrier-metal layer 14 may be made of a titanium nitride (TiN) film, and the first-main electrode 15 may be made of an aluminum (Al) film. The first-main electrode 15 is separately disposed from a gate surface electrode (not shown).

On a bottom surface of the drift layer 2, as illustrated in FIG. 1, an $n^{3o}$-type carrier-extract region 1 is disposed in contact with the drift layer 2. On a bottom surface of the carrier-extract region 1, a second-main electrode 16 is disposed. For the second-main electrode 16, for example, a single-layer metallic film made of gold (Au) or a metallic film laminated in the order of Al, nickel (Ni) and Au can be used, and further, a metallic film, such as molybdenum (Mo), tungsten (W) and the like, or an alloy layer obtained by depositing nickel (Ni) and titanium (Ti) and reacting with SiC may be laminated as a lowermost under-layer of the second-main electrode 16.

In the insulated gate semiconductor device according to the embodiment, a structure in which the carrier-extract region 1 is formed of a semiconductor substrate made of SiC, or a SiC substrate, and the drift layer 2 is formed of an epitaxial layer made of SiC, or a SiC layer, is exemplified. The semiconductor regions implementing the insulated gate semiconductor device according to the embodiment, which include the carrier-extract region 1 and the drift layer 2 is not limited to SiC. In addition to SiC, a hexagonal semiconductor material having a forbidden bandwidth wider than 1.1 eV of Si, such as gallium nitride (GaN), lonsdaleite (hexagonal diamond), aluminum nitride (AlN) or the like, may be used. As for values of the forbidden bandwidths at room temperature, 3.26 eV for 4H—SiC, 3.02 eV for 6H—SiC, 3.4 eV for GaN, 5.5 eV for diamond and 6.2 eV for AlN, are reported respectively. A wide bandgap semiconductor having a forbidden bandwidth of 2.0 eV or more can be used as the carrier-extract region 1, the drift layer 2 and the like, but in an LED or the like, a forbidden bandwidth of 2.5 eV or more may be often defined as a "wide band gap". In the present invention, the forbidden bandwidth of the wide bandgap semiconductor will be described with reference to the forbidden bandwidth of 3.26 eV of 4 H—SiC at room temperature.

Figure 2:
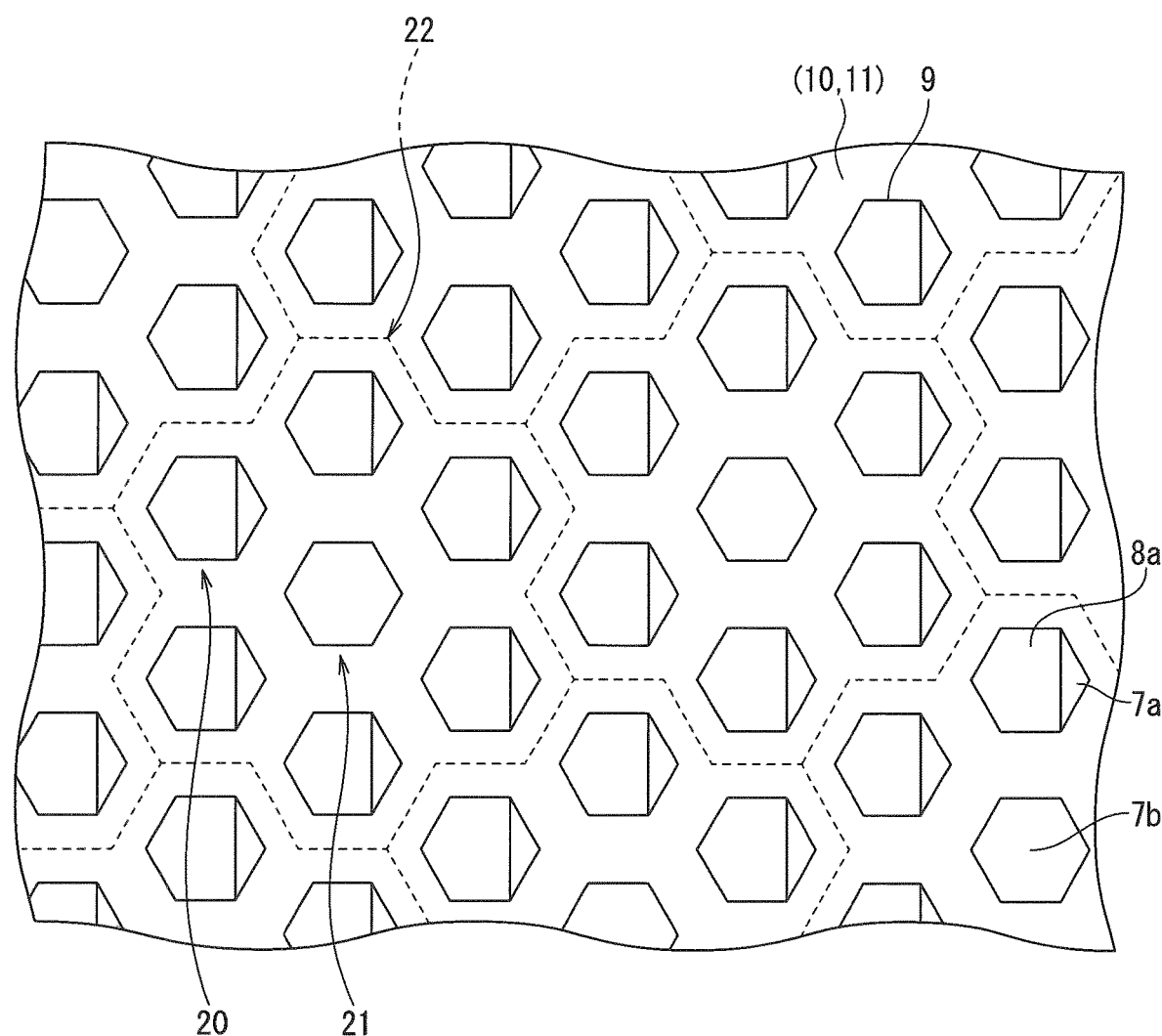
FIG. 2 is a top view of the insulated gate semiconductor device taken along the line II-II in FIG. 1.
Figure 9:
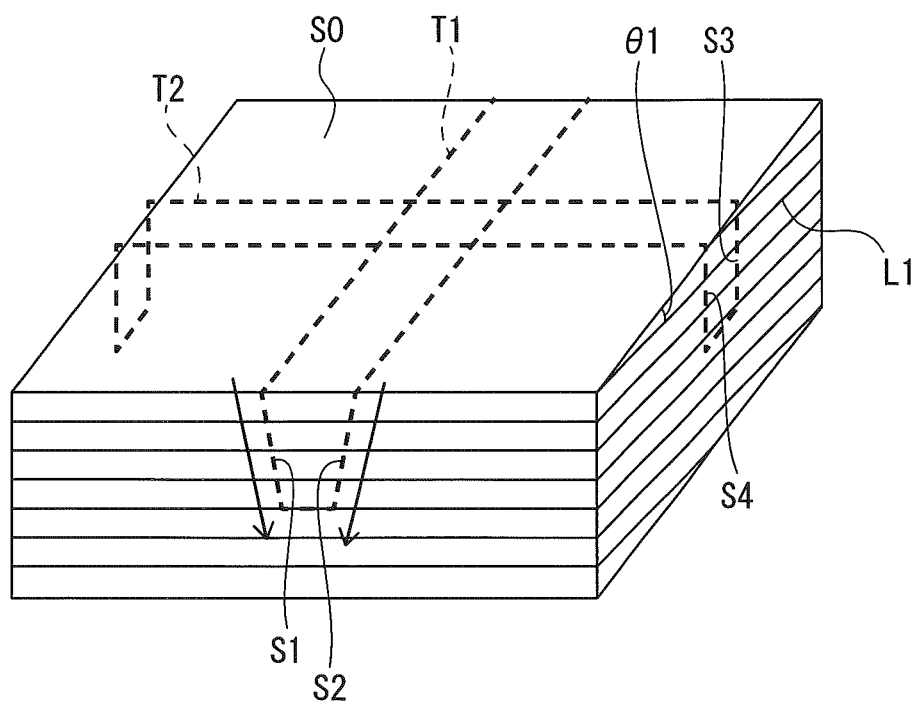
FIG. 9 is a schematic view illustrating a crystal plane orientation of a sidewall of a trench.
Figure 10:
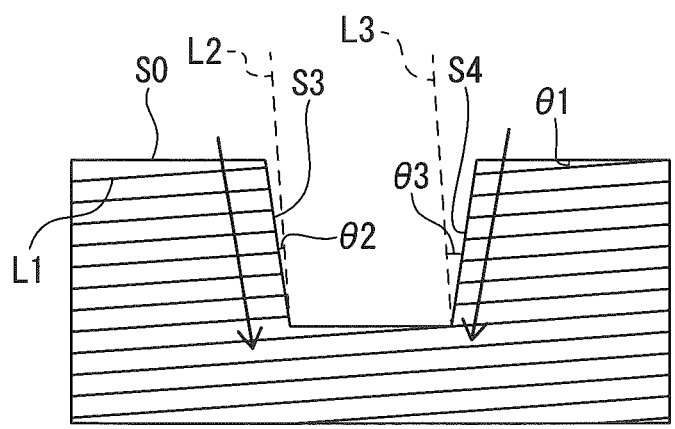
FIG. 10 is a schematic view illustrating the crystal plane orientation of the sidewall of the trench.

As illustrated in FIG. 1, sidewalls of a first pillar 20 having the carrier-supply regions 8a and the first contact region 7a, and sidewalls of a second pillar 21 having the second contact region 7b are defined by the trench 9. As illustrated in FIG. 2, on a principal surface formed by the carrier-supply regions 8a and the first contact regions 7a and the second contact regions 7b, a plurality of regions each having a hexagonal prism-shape implementing the first pillar 20 and the second pillar 21 are arranged to stand close together in a lattice-pattern, or in a honeycomb-structure. The term "hexagonal prism-shape" is intended to include a shape, such as a truncated hexagonal pyramid and the like, which has side walls not vertical as illustrated in FIGS. 9 and 10. In a column-wise of FIG. 2, the first pillars 20 and the second pillars 21 of adjacent columns are shifted by half from each other, and are arranged to stand together to form an inverted honeycomb structure. The first pillars 20 and the second pillars 21 each protrude into a hexagonal prism-shape. For example, a unit cell 22 is formed of a single second pillar 21 and sextuple first pillars 20 arranged around the second pillar 21. The number of first pillars 20 and the second pillar 21 included in the unit cell 22 are not limited. Also, the position of the second pillar 21 is not limited to the center of the unit cell 22.

As illustrated in FIG. 1, in order to protect the gate insulating film 10 at a bottom of the trench 9 from a high voltage during applying a reverse bias, a $p^+$-type gate-bottom protection-regions 4a is disposed at the bottom of the trench 9. On a bottom surface of the second base region 6b under the second contact region 7b, a $p^+$-type base-bottom buried-region (4b, 5) is arranged in a laminated structure. A first buried region 4b in the lower layer of the base-bottom buried-region (4b, 5) forming the laminated structure, or a two-layer structure, is provided at the same horizontal level as the gate-bottom protection-regions 4a and is electrically connected to the gate-bottom protection-regions 4a of the trench 9 which lays out the second pillar 21. A second buried region 5 in an upper layer of the base-bottom buried-region (4b, 5) having a two-layer structure is in contact with the bottom surface of the second base region 6b and the top surface of the first buried region 4b, and electrically connects the second contact region 7b and the gate-bottom protection-regions 4a.

As described above, FIG. 2 is a top view of the structure in which the first pillars 20 and the second pillars 21, each protruding in a hexagonal prism shape, are arranged to stand together, are surrounded by trench 9. For example, the inside of the hexagon illustrated on the lower right side of FIG. 2 is divided into the carrier-supply regions 8a on the left-hand side and the first contact region 7a on the right-hand side, such that the planar shape of the first contact region 7a becomes a triangle. The sidewall of the first pillar 20 formed by the carrier-supply regions 8a on the left-hand side and the first contact region 7a on the right-hand side corresponds to any sidewall of the regular hexagonal prism. The first pillar 20 having a hexagonal prism-shape protrudes to be surrounded by the trench 9. That is, the four sides of the carrier-supply regions 8a are in contact with the sidewalls of the trench 9. As a result of dividing the hexagon, a planar pattern of the first contact region 7a is triangular and two sides of the first contact region 7a are in contact with the sidewalls of the trench 9. In FIG. 2, the long side of the triangle formed by the first contact region 7a is arranged on a line extending in a vertical direction connecting upper and lower vertexes on the right side of the hexagon surrounded by the sidewalls of the trench 9.

During operation of the insulated gate semiconductor device according to the embodiment, a positive voltage is applied to the second-main electrode 16 and a positive voltage equal to or higher than a threshold value is applied to the gate electrode 11. Thus, inversion-channels are induced respectively in the first base regions 6a and the second base regions 6b at a side of the gate insulating film 10, and a potential for electrons as carriers is lowered. In the channel formed right under the carrier-supply regions 8a, carriers are injected from the carrier-supply regions 8a into the drift layer 2 via the inversion layer induced between the $n^+$-type carrier-supply regions 8a and the n-type current spreading layer 3 or the $n^-$-type drift layer 2, to flow a main current. On the other hand, in the channel directly under the p+-type first contact regions 7a and the p+-type second contact regions 7b, since electrical connection by electrons cannot be made, the main current does not flow. Thus, in the first pillar 20 protruding in a hexagonal prism-shape surrounded by the trench 9, the first contact region 7a disposed in the upper part will "disable" the channel region. Here, "disable" represents deactivation of the electrical connection to the channel, which is directly under the first contact region 7a and the second contact region 7b, establishing the disconnection of the channel.

Figure 3:
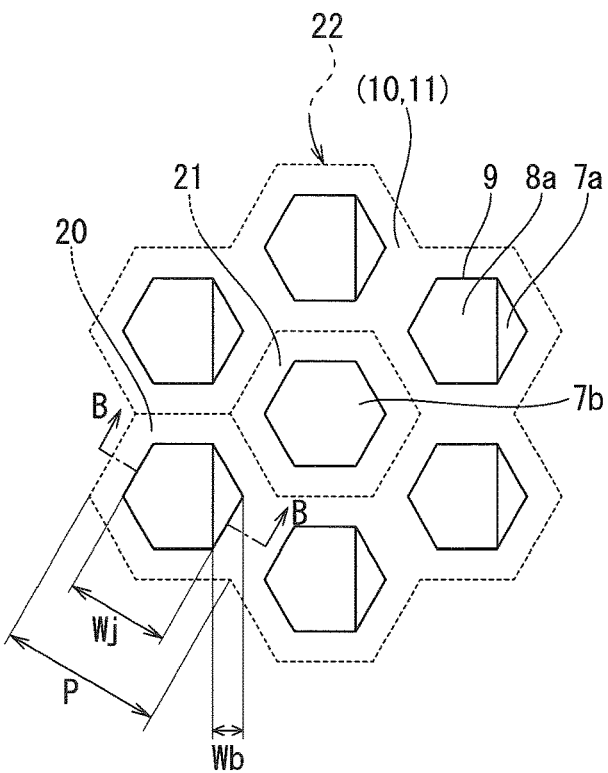
FIG. 3 is a schematic top view illustrating a unit cell of the insulated gate semiconductor device according to the embodiment of the present invention.
Figure 4:
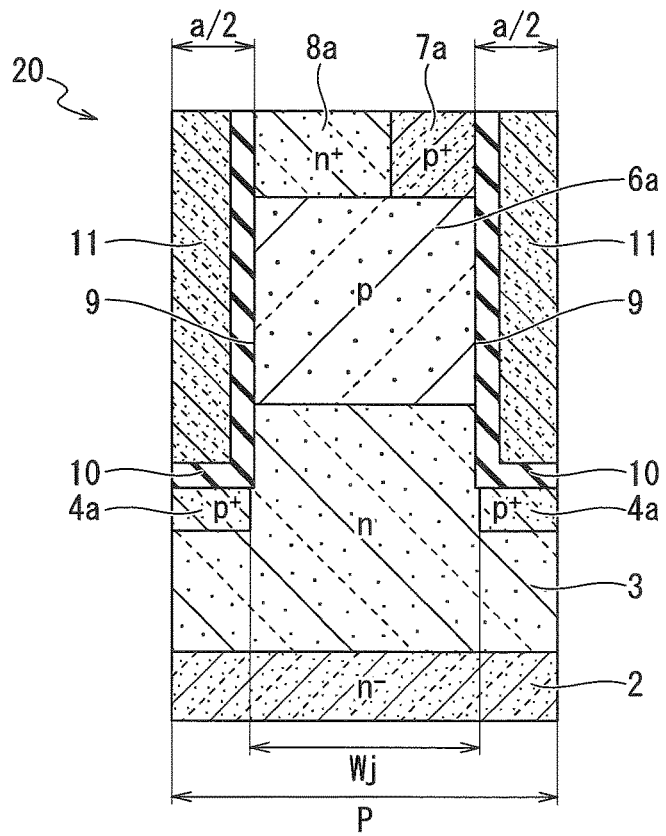
FIG. 4 is a schematic cross-sectional view of a first pillar as viewed from direction IV-IV in FIG. 3.

FIG. 3 is a plan view of the "unit cell 22" seen from the top of the carrier-supply regions 8a and the first and second contact layers 7a, 7b. In the following description, for simplicity of description, a main explanation will be given using the "unit cell" defined in FIG. 3. FIG. 4 is a cross-sectional view of the first pillar 20 taken along line IV-IV illustrated in FIG. 3. In a hexagon which is formed of boundaries between adjacent honeycomb cells indicated by the broken line in FIG. 3, the interval between a pair of mutually parallel sides of the hexagon is defined as a "cell pitch P". The "cell pitch P" may be regarded as the interval between a pair of mutually parallel sides of the area occupied by the regular hexagonal first pillars 20 in the unit cell 22 illustrated in FIG. 3. In FIG. 3, the distance between the side walls of the trench 9 facing each other in the first pillar 20 is defined as a "JFET width Wj". As illustrated in FIGS. 2 and 3, because the first contact regions 7a are respectively shaped into an isosceles triangle in a planar pattern, the altitude, or the height between the base—the long side of the triangle—and the vertex opposite to the base is defined as a "disable-width Wb". Further, as illustrated in FIG. 4, a feature size of the gate-bottom protection-regions 4a in a planar pattern is defined as a "minimum feature size a". Here, the width of the trench 9 measured between adjacent first pillars 20 will be approximately the order of the "minimum feature size a".

In the insulated gate semiconductor device according to the embodiment, as illustrated in FIG. 1, the gate-bottom protection-regions 4a of each first pillar 20 is connected to the first buried region 4b of the base-bottom buried-region (4b, 5). Therefore, the gate-bottom protection-regions 4a is connected to the second contact region 7b arranged at the center of the unit cell 22 illustrated in FIG. 3 with low resistance, and dielectric breakdown of the gate insulating film 10 may be prevented. Further, as illustrated in FIG. 4, the width of the current spreading layer 3 between the opposing gate-bottom protection-regions 4a is "the JFET width Wj" which is provided by the spacing of the buried gate region corresponding to the spacing between the opposing gate-bottom protection-regions 4a. As can be seen from FIG. 4, since no p-type buried region is provided below the carrier-supply regions 8a and the first contact region 7a, it is possible to reduce the JFET width Wj. In addition, since the JFET width Wj needs to be kept equal to or larger than a certain value in order to suppress an increase in on-resistance, the JFET width Wj is limited in reduction. The cell pitch P of the first pillar 20 is the sum of the JFET width Wj and the minimum feature size a:

$P = Wj + a.$

Therefore, when the JFET width Wj is reduced to the minimum limit, the cell pitch P can be reduced to the minimum feature size.

Figure 5:
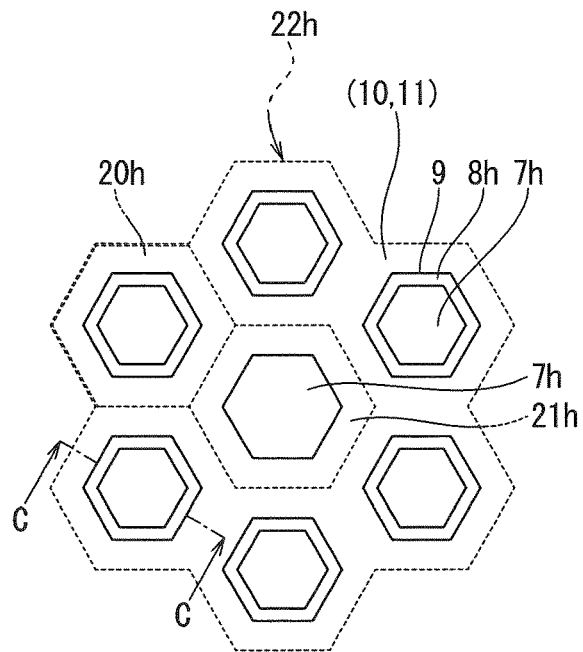
FIG. 5 is a schematic top view of a unit cell illustrating an example of the earlier insulated gate semiconductor device.
Figure 6:
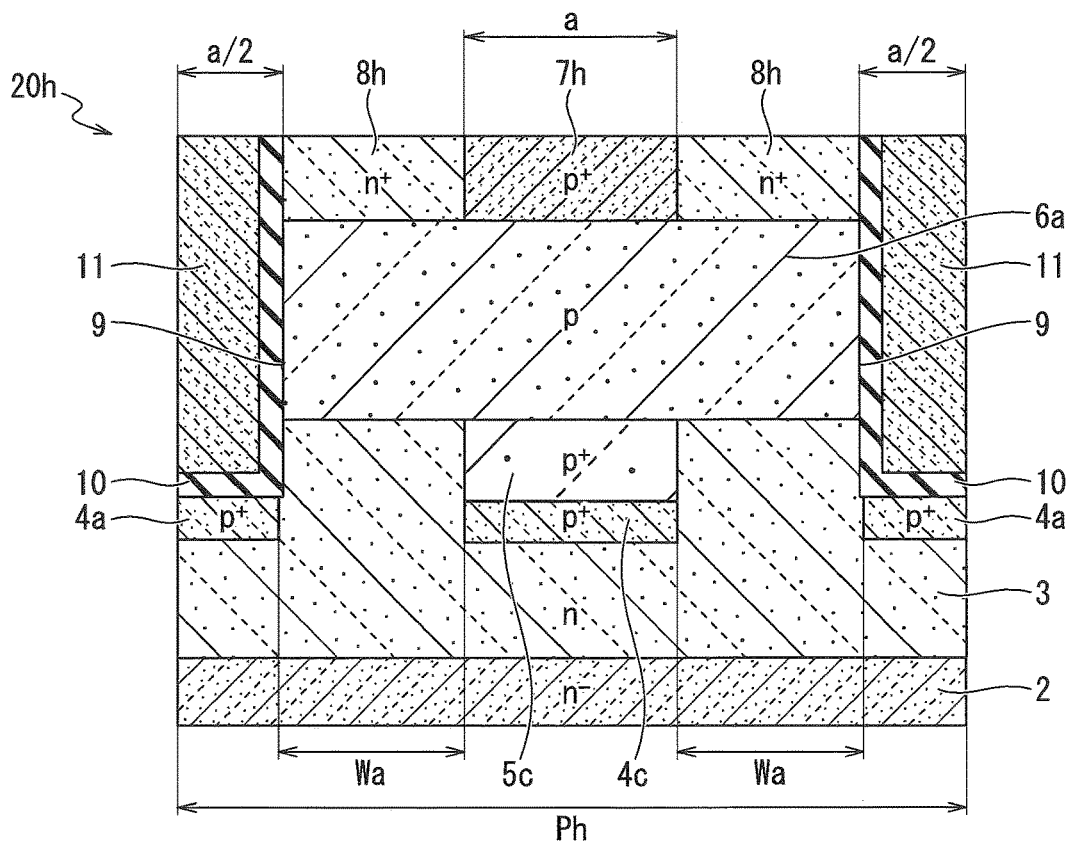
FIG. 6 is a schematic cross-sectional view of a first pillar as viewed from direction VI-VI in FIG. 5.

FIG. 5 is a plan view of a unit cell 22h as viewed from a top of source regions 8h and base contact regions 7h in the earlier insulated gate semiconductor device as a first comparative example to the insulated gate semiconductor device according to the above-mentioned present embodiment. The cell structure of the first comparative example has a hexagonal prism-shape, like the present embodiment. FIG. 6 is a cross-sectional view of a first pillar 20h taken along a line VI-VI in FIG. 5. In the first comparative example, as illustrated in FIGS. 5 and 6, the source regions 8h are arranged in peripheries of the base contact regions 7h to contact with all of the side walls of the hexagonal prism-shape cut by the trench 9. The base contact regions 7h are provided at the center of the source regions 8h surrounding the peripheries of the base contact regions 7h. In addition, a second pillar 21h with a hexagonal prism-shaped base contact region 7h surrounded by the trench 9 is provided at the center of the unit cell 22h. As illustrated in FIG. 6, a p+-type base-bottom buried-region (4c, 5c) is arranged on the bottom surface of the first base region 6a below the base contact region 7h. A buried region 4c under the base-bottom buried-region (4c, 5c) forming a laminated structure is provided at the same horizontal level as the gate-bottom protection-regions 4a and is electrically connected to the gate-bottom protection-regions 4a of the trench 9. A second buried region 5c in the upper layer of the base-bottom buried-region (4c, 5c) is in contact with the bottom surface of the first base region 6a and the top surface of the buried region 4c, and electrically connects the base contact region 7h and the gate-bottom protection-regions 4a.

In the first comparative example, since each of the source regions 8h is in contact with all of the sextuple sidewalls of the trench 9 to circle around the periphery, there is no behavior of the inactivation of the channel. In the first pillar 20h, a JFET width Wa is between the gate-bottom protection-regions 4a and each of the buried regions 4c located on the left and right of FIG. G. In the case of forming the base-bottom buried-region (4c, 5c) with the minimum feature size, in the first comparative example, a cell pitch Ph of the first pillar 20h is twice the sum of the JFET width Wa and the minimum feature size a:

$Ph = 2(Wa + a).$

The JFET width Wa needs to be kept equal to or larger than a certain value in order to suppress an increase in on-resistance. For example, if the JFET width Wa of the first comparative example is equal to the JFET width Wj of the present embodiment, the cell pitch Ph of the first comparative example may be as large as about twice the cell pitch P of the present embodiment.

Figure 7:
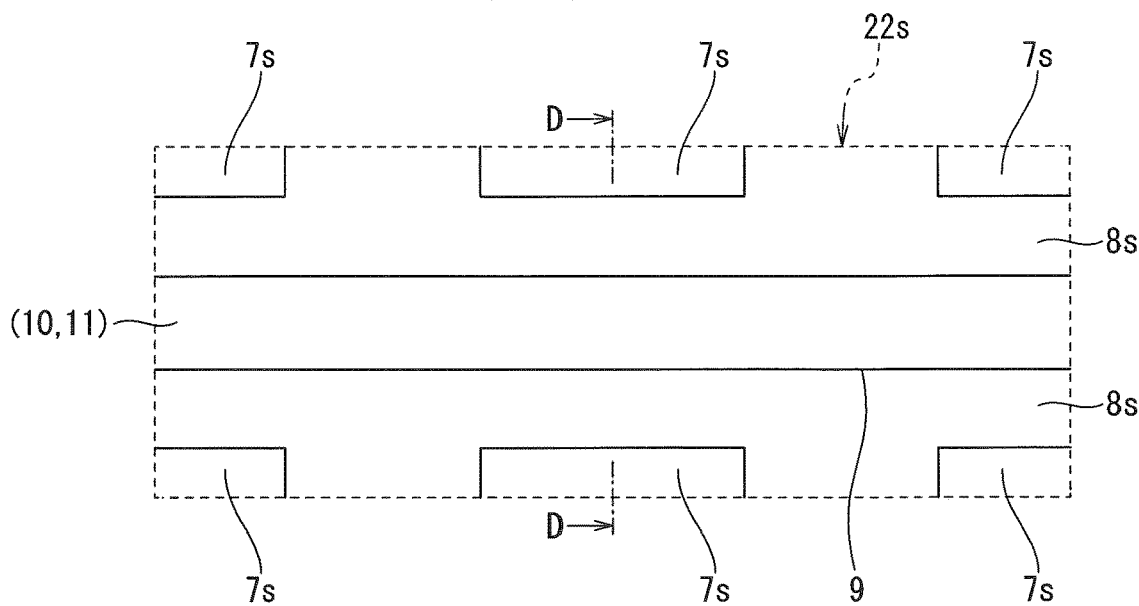
FIG. 7 is a schematic top view of a main part of a unit cell for explaining another example of the earlier insulated gate semiconductor device.
Figure 8:
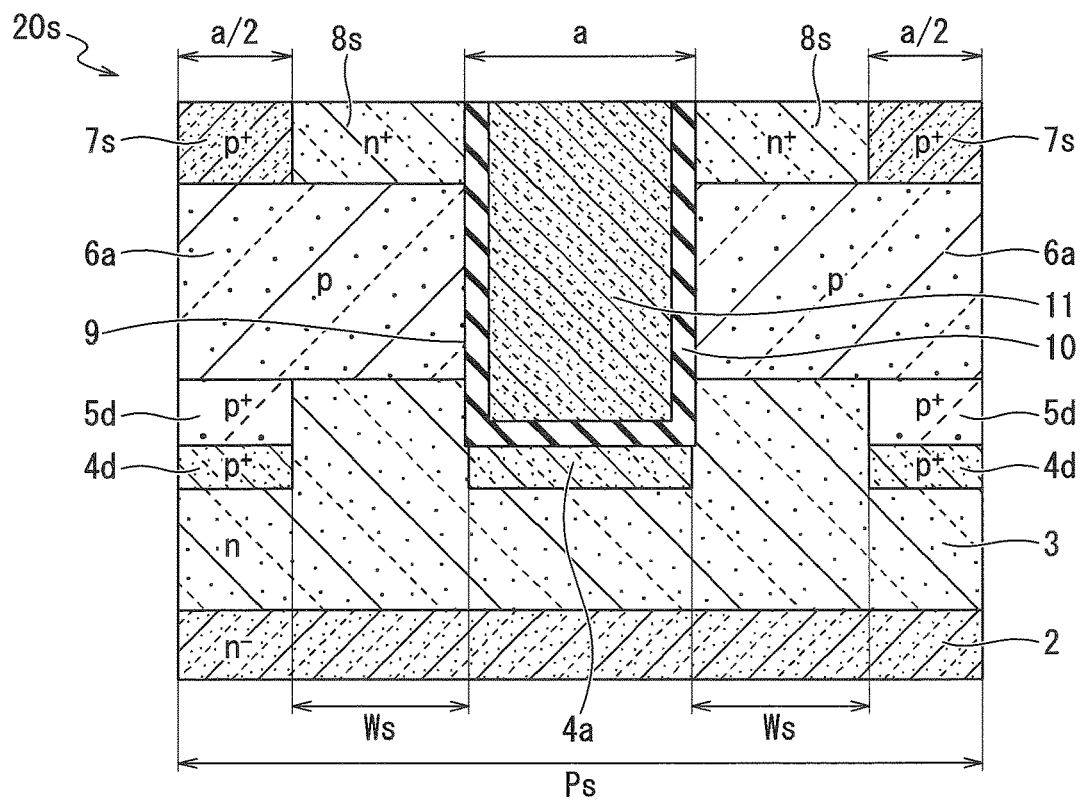
FIG. 8 is a schematic cross-sectional view of a first pillar as viewed from direction VIII-VIII in FIG. 7.

FIG. 7 is a plan view of a unit cell 22s as viewed from a top of source regions 8s and base contact regions 7s in an insulated gate semiconductor device having an earlier planar layout of a stripe-shape as a second comparative example to the insulated gate semiconductor device of the embodiment. FIG. 8 is a cross-sectional view of a first pillar 20s taken along a line VIII-VIII in FIG. 7. In the second comparative example, as illustrated in FIGS. 7 and 8, the source regions 8s are provided in contact with sidewalls of the stripe-shaped trench 9. The base contact regions 7s are provided at boundary portions of the unit cell 22s. As illustrated in FIG. 8, p+-type base-bottom buried-regions (4d, 5d) are arranged on bottom surfaces of the base regions 6a below the base contact regions 7s. A plurality of buried regions 4d, which is each of the lower layers of the base-bottom buried-regions (4d, 5d), is provided at the same horizontal level as the gate-bottom protection-regions 4a of the trench 9 and is electrically connected to the gate-bottom protection-regions 4a. A plurality of second buried regions 5d, which is each upper layer of the base-bottom buried-regions (4d, 5d), is in contact with the bottom surface of the first base region 6a and the top surface of the buried regions 4d, and electrically connects the base contact region 7s and the gate-bottom protection-regions 4a.

In the second comparative example, since each of the source regions 8s is provided in contact with the sidewall of the stripe-shaped trench 9, there is no behavior of the inactivation of the channel. In the first pillar 20s, a JFET width Ws is between the gate-bottom protection-regions 4a and each of the buried regions 4d located on the left and right of FIG. 8. In the case of forming the base-bottom buried-regions (4d, 5d) with the minimum feature size, in the second comparative example, a cell pitch Ps of the first pillar 20s is twice the sum of the JFET width Ws and the minimum feature size a:

$$Ph=2(Ws+a).$$

For example, if the JFET width Ws of the second comparative example is set to be approximately equal to the JFET width Wj of the present embodiment, the cell pitch Ps of the second comparative example may be large as about twice the cell pitch P of the present embodiment.

As described above, in the insulated gate semiconductor device of the embodiment, as illustrated in FIGS. 1 to 4, the inside of the first pillar 20 is divided into the carrier-supply region 8a and the first contact region 7a in contact with the sidewalls of the trench 9. In the second pillar 21, only the second contact region 7b is provided. The second contact regions 7b are electrically connected to the gate-bottom protection-regions 4a provided at the bottoms of the trench 9 via the base-bottom buried-regions (4b, 5) provided below the second contact regions 7b. Therefore, the dielectric breakdown of the gate insulating film 10 can be prevented. In addition, since the JFET width Wj can be reduced as compared with the first and second comparative examples according to the earlier technologies, it is possible to reduce the cell pitch P to about one half.

Figure 11:
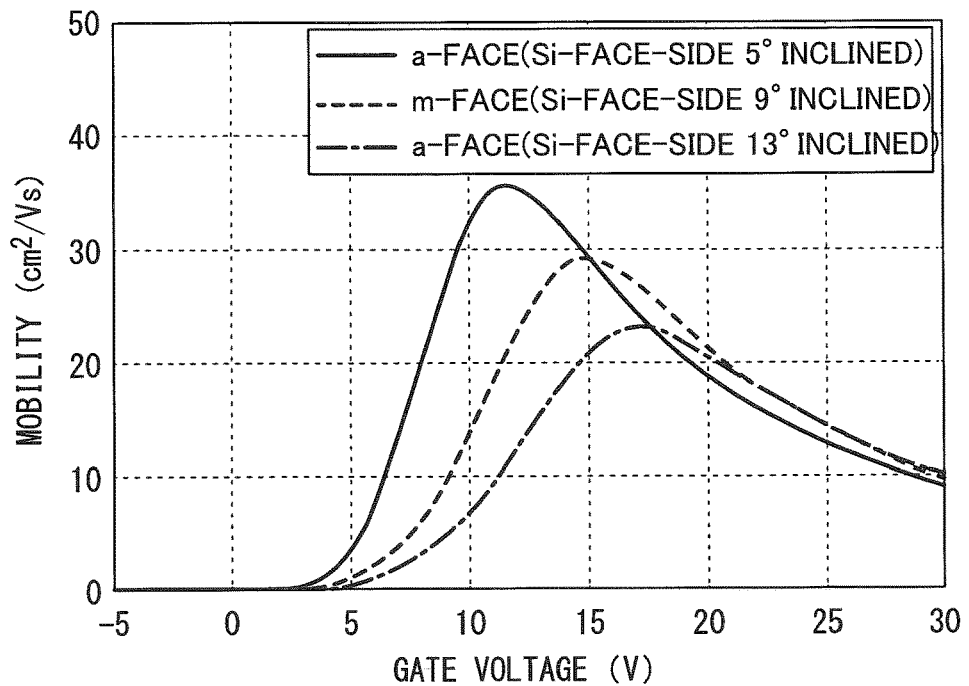
FIG. 11 is a graph illustrating a relationship between a gate voltage and mobility regarding the crystal plane orientation of the sidewall of the trench.

With reference to FIGS. 9 to 11, a crystal plane orientation to be used for the sidewalls of the trench 9 illustrated in FIG. 1 will be described. As illustrated in FIG. 9, a layered structure, in which the trench 9 illustrated in FIG. 1 are cut, is, for example, based on a semiconductor chip having an off-angle θ1 of about zero degree to eight degrees in the <11-20> direction with respect to the <0001> direction. The off-angle θ1 is defined by an angle between a basal plane perpendicular to the c-axis, which is the (0001) plane (Si-face) or the (000-1) plane (C-face), and a reference plane of the layered structure in the subject semiconductor device, which is defined as the principal surface of the semiconductor chip. As a result, the upper end face of the first pillar 20 defined by the top surface of each of the carrier-supply regions 8a and the first contact regions 7a is inclined in the <11-20> direction by the off-angle θ1 of about zero degree to eight degrees. A straight line L1 indicated by a plurality of solid lines on the side-face of the layered structure schematically illustrates the Si-faces. Consider a case for digging a trench T1 and a trench T2 orthogonal to the trench T1 in the layered structure. The sidewalls S1 and S2 of the trench T1 are m-faces that are (1-100) planes perpendicular to the (0001) plane. Since the sidewalls S1 and S2 of the trench T1 are defined to be a tapered shape, both the sidewalls S1 and S2 of the trench T1 are the m-faces inclined by about nine degrees toward the Si-face.

FIG. 10 illustrates the case where the trench T2 is dug in the layered structure. As illustrated in FIG. 10, the opposing sidewalls S3 and S4 of the trench T2 use a-faces which are the (11-20) planes. In FIG. 10, broken lines L2 and L3 parallel to the a-faces are schematically illustrated. In the present case, since the semiconductor chip has the off-angle θ1, an inclination angle θ2 of one sidewall S3 of the trench T2 with respect to the a-face is different from an inclination angle θ3 of the other sidewall S4 with respect to the a-face. For example, in the case where the off-angle θ1 is four degrees and the sidewalls of the trenches is inclined nine degrees from the vertical direction, the inclination angle θ2 of the sidewall S3 of the trench T2 on the Si-face-side with respect to the a-face is five degrees and the inclination angle θ3 of the sidewall S4 of the trench T2 on the Si-face-side with respect to the a-face is thirteen degrees. FIG. 11 illustrates a relationship between a gate voltage and a mobility of electrons for the m-face inclined at nine degrees to the Si-face-side, the a-face inclined at five degrees to the Si-face-side, and the a-face inclined at thirteen degrees to the Si-face-side. From FIG. 11, the electron mobility is high in the order of the a-plane inclined five degrees to the Si-face-side, the m-face inclined nine degrees to the Si-face-side, and the a-face inclined thirteen degrees to the Si-face-side. As described above, in the trenches formed on the surface having the off-angle, the inclination angles occurring on the sidewalls of the trenches may be different from each other, and accordingly the carrier mobility in the sidewalls of the trenches may be different.

Figure 12:
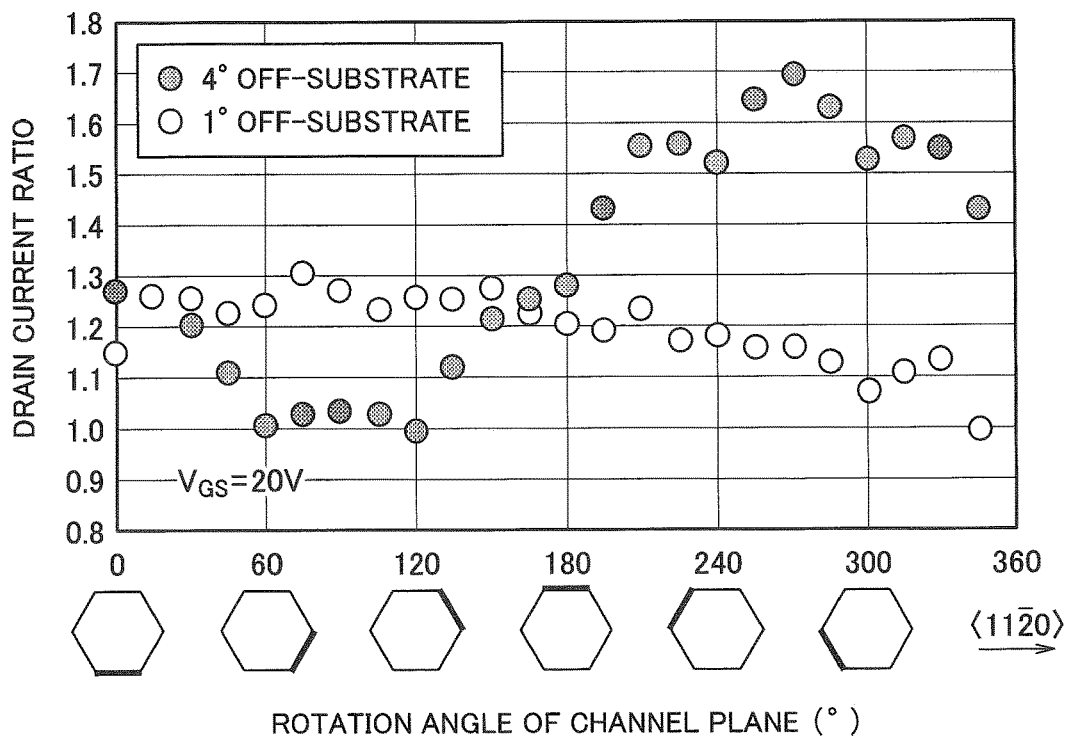
FIG. 12 is a graph illustrating a relationship between a rotation angle of a channel plane formed on the sidewall of the trench and a drain current ratio.

Moreover, FIG. 12 a graph illustrating a drain current ratio of trench gate MISFET having channels rotated counterclockwise by 15 degrees with respect to the (1-100) plane on a four-degrees-off substrate and a one-degree-off substrate (refer to H. Matsunami, et al., "Semiconductor SiC technology and application", 2nd edition, Nikkan Kogyo Shimbun, 2011, pp. 368-369). An inclined angle of the trench sidewall is approximately 90 degrees with respect to the substrate surface and the drain current ratio is about 1.3 and about 1.7 at maximum with the one-degree-off substrate and the four-degrees-off substrate, respectively. Channel planes corresponding to rotation angles of 60 degrees and 120 degrees at which the drain current ratio becomes the minimum on the four-degrees-off substrate are (0-110) plane and (−1010) plane, respectively.

Normally, a trench may be dug by dry etching, but it is difficult to establish substantially vertical sidewalls of the trench by dry etching. Therefore, since the sidewall of the trench has a certain inclination angle, the above-mentioned "hexagonal prism-shape" includes a three-dimensional shape having an inclined sidewall indicated by the shape of a truncated hexagonal pyramid and the like. In addition, in the latter part of the present specification, reference will be made to a shape such as an "octagonal prism-shape". It should be noted that the expression "prism-shape" of the present invention denotes including a three-dimensional shape similar to a "truncated pyramid" surrounded by the inclined trench sidewalls. As illustrated in FIG. 11, when a substrate having an off-angle in the <11-20> direction is used, the electron mobility of the channel decreases as the inclined angle of the trench sidewall increases. That is, since the principal surface of the substrate has an off-angle in the <11-20> direction, the electron mobility decreases in the trench sidewall formed on one side in the <11-20> direction. When the off-angle of the substrate is two degrees or more and eight degrees or less, the same result may be achieved. Therefore, in the insulated gate semiconductor device of the embodiment, it is preferable that the upper end face of the first pillar 20 has an off-angle of about two degrees to eight degrees in the <11-20> direction with respect to the <0001> direction. Here, "the upper end surface of the first pillar 20" is a plane defined by the top surface of each of the carrier-supply regions 8a and the first contact regions 7a, as described above. In addition, two degrees or more denotes a numerical value including an error of ±0.5 degree.

Figure 13:
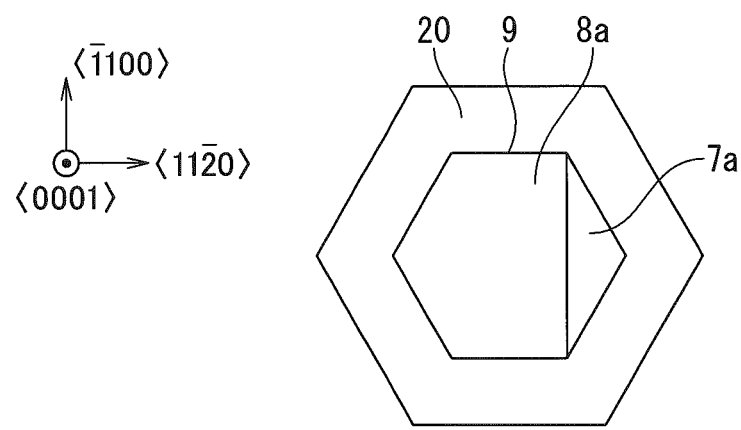
FIG. 13 is a schematic plan view illustrating a placement orientation of the first pillar of the insulated gate semiconductor device according to the embodiment of the present invention.

In the insulated gate semiconductor device of the embodiment, as illustrated in FIG. 13, by using the four-degrees-off substrate, a pair of parallel sides on the top surface of the first pillar 20 protruding in a hexagon-shape is aligned in the <11-20> direction. In the present case, the sidewalls of the trench 9 on the lower side in FIG. 13 are the (1-100) plane and the sidewalls of the trench 9 corresponding to the rotation angles of 60 degrees and 120 degrees is located on one side toward the <11-20> direction. As illustrated in FIG. 13, the first contact region 7a is provided so as to contact the sidewalls of the trench 9 corresponding to the rotation angles of 60 degrees and 120 degrees. The surface in contact with the first contact region 7a is the surface having the minimum drain current ratio illustrated in FIG. 12. Therefore, it is possible to increase the drain current ratio on the sidewalls of the trench 9 where the carrier-supply region 8a is in contact with and to reduce the on-resistance.

As described above, in the insulated gate semiconductor device of the embodiment, since the base-bottom buried-regions (4b, 5) are not provided in the first pillars 20, the cell pitch P can be reduced even if the JFET width is secured. In the second pillars 21, the base-bottom buried-regions (4b, 5) are provided to be electrically connected to the gate-bottom protection-regions 4a, and the dielectric breakdown of the gate insulating film 10 can be prevented. Further, in the principal surface having the off-angle of two degrees or more and eight degrees or less, a pair of mutually parallel sides of the first pillar 20, which is protruding in a hexagonal prism-shape, are aligned with the <11-20> direction. By disposing the first contact region 7a on one side in the <11-20> direction, the sidewalls of the trench 9 having high electron mobility can be used. As a result, it is possible to increase the channel density and to reduce the on-resistance.

<Manufacturing Method>

Next, with reference to FIGS. 14A to 19B, FIGS. 14B to 19B and FIG. 20, a manufacturing method of the insulated gate semiconductor device of the embodiment will be given by taking a trench gate MISFET as an example. Each of FIGS. 14A to 19A illustrates a layout plan view, and each of FIGS. 14B to 19B illustrates a cross-sectional view taken perpendicularly from the two-dot chain line indicated in each layout plan view of FIGS. 14A to 19A. Note that the manufacturing method of the trench gate MISFET described below is merely an example and may be achieved by various other manufacturing methods including a modification as long as the gist described in the claims is included.

Figure 14A:
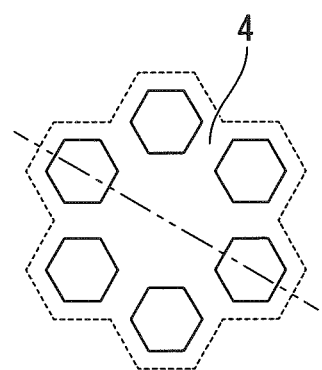
FIGS. 14A and 14B are a schematic top view and a schematic cross-sectional view illustrating an example of a process in a manufacturing method of the insulated gate semiconductor device according to an embodiment.
Figure 14B:
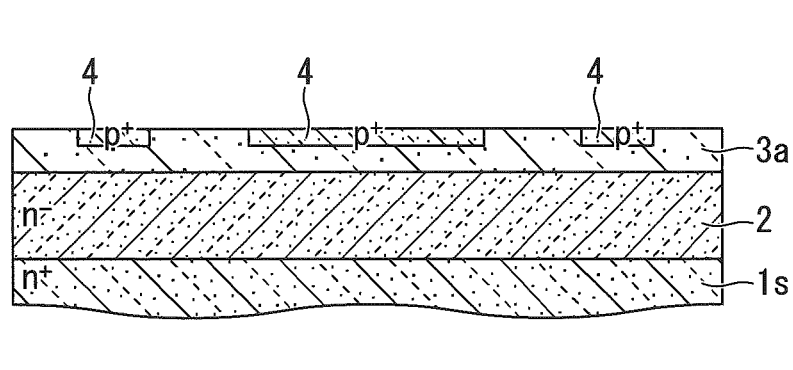

First, an n$^+$-type SiC substrate (substrate) is to which an n-type impurity such as nitrogen (N) is doped is prepared. The substrate is is a 4H—SiC substrate and has an off-angle of four degrees in the <11-20> direction with respect to the c-axis. As illustrated in FIG. 14B, the n$^+$-type drift layer 2 is epitaxially grown on a top surface of the substrate 1s. From a top surface side of the drift layer 2, n-type impurity ions such as nitrogen (N) are implanted by multiple-energy ion implantation over the entire surface of the drift layer 2. Thereafter, the implanted n-type impurity ions are activated by annealing to form the n$^+$-type first current spreading layer 3a. Note that the first current spreading layer 3a may be epitaxially grown on the top surface of the drift layer 2. In addition, the first current spreading layer 3a may not be necessarily formed, and the following process may be executed on the drift layer 2.

In order to form the gate-bottom protection-regions 4a and the first buried region 4b illustrated in FIG. 1, a photoresist film is coated on the top surface of the first current spreading layer 3a, and the coated photoresist film is delineated by a photolithography technique. And the delineated photoresist film, which is left in a region corresponding to the first pillars 20 illustrated in FIG. 2, is used as a mask for ion implantation of p-type impurity ions, such as Al and the like, by multiple-energy ion implantation. A pattern of the photoresist film is a hexagonal prism-shape, and a set of parallel sides of the hexagonal prism-shape extend in the <11-20> direction. After removing the ion-implantation mask, the implanted p-type impurity ions are activated by thermal annealing. As a result, as illustrated in FIGS. 14A and 14B, a plurality of p$^+$-type buried region 4, which corresponds to the gate-bottom protection-regions 4a and the first buried regions 4b, is selectively formed above the first current spreading layer 3a.

As illustrated in FIG. 15B, an n$^+$-type second current spreading layer 3b having the same impurity concentration as that of the first current spreading layer 3a is epitaxially grown on the top surface of the first current spreading layer 3a and the buried regions 4, so that the current spreading layer 3 is implemented by the first current spreading layer 3a and the second current spreading layer 3b. Thereafter, a photoresist film is coated on the top surface of the current spreading layer 3, and the coated photoresist film is delineated by a photolithography technique. And the delineated photoresist film, which is left in a region corresponding to the second buried region 5 illustrated in FIG. 1, is used as a mask for ion implantation of p-type impurity ions, such as Al and the like, by multiple-energy ion implantation. After removing the ion implantation mask, the implanted p-type impurity ions are activated by thermal annealing. As a result, as illustrated in FIGS. 15A and 15B, the p$^+$-type second buried region 5 reaching the buried regions 4 through the second current spreading layer 3b is selectively formed.

As illustrated in FIG. 16B, a p-type base region 6s is epitaxially grown on the top surface of the current spreading layer 3. Next, n-type impurity ions, such as N ions and the like, are implanted by multiple-energy ion implantation from the top surface side of the base region 6s. Thereafter, a photoresist film is coated on the base region 6s into which the n-type impurity ions are implanted, and the coated photoresist film is delineated by a photolithography technique. In the delineated resist film, a stripe-shaped opening, extending in the <1-100> direction, to expose a region corresponding to the first contact region 7a and a rectangular-shaped opening, to expose a region corresponding to the second contact regions 7b are formed. Using the delineated photoresist film as a mask for ion implantation, p-type impurity ions, such as Al and the like, are implanted by multiple-energy ion implantation. After removing the ion implantation mask, the implanted n-type impurity ions and the implanted p-type impurity ions are activated by thermal annealing. As a result, as illustrated in FIGS. 16A and 16B, n$^+$-type carrier-supply regions 8, p$^+$-type first contact region 7 and a p$^+$-type second contact region 7s are selectively buried in the upper portion of the base region G. The carrier-supply regions 8 and the first contact regions 7 are adjacent to each other and extend in the <1-100> direction. The second contact region 7s is connected to the first contact region 7 which faces the second contact region 7s.

Although a case where the thermal annealing is executed for each ion implantation in the processes of forming the buried regions 4, the second buried region 5, the carrier-supply regions 8, and the first contact region 7a and the second contact region 7s has been exemplified, the thermal annealing may not be executed for each ion implantation. For example, after the multiple-energy ion implantations for forming the buried regions 4, the second buried region 5, the carrier-supply regions 8, and the first contact region 7a and second contact region 7s are respectively executed, each of the ion implanted regions may be simultaneously activated.

A photoresist film is coated on the top surfaces of the carrier-supply regions 8, the first contact region 7 and second contact region 7s and the coated photoresist film is delineated by a photolithography technique. Using the delineated photoresist film as an etching mask, trench 9 is selectively cut by a dry etching technique, such as reactive ion etching (RIE) or the like. The trench 9 penetrates the carrier-supply regions 8, the first contact region 7a, second contact region 7s, and the base region 6s, and reaches the buried regions 4 in the current spreading layer 3. Thereafter, the photoresist film is removed. As a result, as illustrated in FIGS. 17A and 17B, the first pillars 20 and the second pillar 21 are defined by the trench 9. On the bottom surface of the trench 9, the gate-bottom protection-regions 4a are exposed. In the first pillars 20, the carrier-supply regions 8a, the first contact regions 7a, the base regions 6a, and the current spreading layer 3 are exposed on the sidewalls of the trench 9. In the second pillar 21, the second contact regions 7b, the first base region 6a, and the current spreading layer 3 are exposed on the sidewalls of the trench 9. In the first pillars 20 protruding in a hexagonal prism-shape, the first contact regions 7a are arranged on one side facing the <11-20> direction. Instead of using the photoresist film as an etching mask, an oxide film is deposited on the top surfaces of the carrier-supply regions 8 and the first contact region 7a and second contact region 7s, and after the deposited oxide film is delineated using a photoresist film, the delineated oxide film may be used as an etching mask.

The gate insulating film 10, such as a $SiO_2$ film and the like, is formed on the bottom surface and the side-face of the trench 9 and the top surfaces of the carrier-supply regions 8a, the $p^+$-type first contact region 7a and the second contact regions 7b, by a thermal oxidation method, a chemical vapor deposition (CVD) method and the like. Next, a doped polysilicon layer, which is heavily doped with impurities such as phosphorus (P) and the like, is deposited by a CVD method and the like so as to bury the trench 9. Thereafter, as illustrated in FIG. 18B, the gate electrode 11 made of the polysilicon layer is formed by selectively removing a part of the polysilicon layer and a part of the gate insulating film 10 by a photolithography technique and dry etching, so as to form an insulated-gate electrode-structure (10, 11).

An insulating film is deposited on the top surface of the insulated-gate electrode-structure (10, 11), implemented by the gate electrode 11 and the gate insulating film 10, by a CVD method and the like. Then, a part of the deposited insulating film is selectively removed by a photolithography technique and dry etching. As a result, as illustrated in FIGS. 18A and 18B, main-electrode contact-holes are formed in the interlayer insulating film 12. Although illustration is omitted, gate contact-holes are also formed in the interlayer insulating film 12 so as to expose a part of the gate surface electrode connected to the gate electrode 11 at a portion different from the main-electrode contact-holes.

A metallic layer, such as a Ni film and the like, is deposited by a sputtering method, an evaporation method, and the like, and the deposited metallic layer is delineated by a photolithography technique, RIE and the like. Thereafter, as illustrated in FIGS. 19A and 19B, the contact-improving layer 13 is formed by rapid thermal annealing (RTA), for example, at 1000 degree centigrade. Next, a metallic layer, such as a TiN film and the like, is deposited by a sputtering method and the like, and the deposited metallic layer is delineated by a photolithography technique, RIE and the like to form the barrier-metal layer 14. As a result, as illustrated in FIG. 20, the contact-improving layer 13 is formed on the top surface of the carrier-supply regions 8a, the first contact regions 7a and the second contact regions 7b, and the barrier-metal layer 14 is formed so as to cover the interlayer insulating film 12. Next, a metallic layer, such as an Al film and the like, is deposited by a sputtering method and the like. A pattern of the first-main electrode 15 and a gate surface electrode (not shown) is delineated by patterning the deposited metallic layer, such as the Al film and the like, by a photolithography technique and RIE and the like. As a result, the pattern of the first-main electrode 15 and the pattern of the gate surface electrode are separated. Further, the bottom surface of the substrate is is polished by chemical mechanical polishing (CMP) and the like to adjust a thickness to form the carrier-extract region 1. Thereafter, a second-main electrode 16 made of Au and the like is deposited on the entire bottom surface of the carrier-extract region 1 by a sputtering method, an evaporation method, and the like. Thus, the insulated gate semiconductor device illustrated in FIG. 20 is completed.

According to the manufacturing method of the insulated gate semiconductor device of the present embodiment, it is possible to achieve the insulated gate semiconductor device, in which the electric field strength applied to the gate insulating film 10 located at the bottoms of the trench 9 can be reduced, and the channel density can be increased so as to reduce the on-resistance.

In the process of forming the first contact region 7a, the disable-width Wb illustrated in FIG. 3 may vary due to a deviation in mask alignment or the like. When the disable-width Wb decreases, there is an advantage that the total channel width per the unit cell 22 increases. At the same time, when the disable-width decreases, the area of the first contact region 7a decreases, and the sidewalls of the trench 9 having a low electron mobility is served for the channel. On the contrary, when the disable-width Wb increases, there is an advantage that the area of the first contact region 7a increases. At the same time, there is a disadvantage that the total channel width per the unit cell 22 decreases. The optimum location of the inactivation by the first contact region 7a is determined by the total channel width per the unit cell 22, the area of the first contact region 7a, and electron mobility of the sidewall channel of the trench 9. As illustrated in FIG. 2 and FIG. 3, the line connecting the opposing two vertexes of the hexagonal prism-shape is the optimum location for inactivation. In the present case, a value of [Wb/Wj] is about 29%, but also the value of [Wb/Wj] may be preferably in a range of 20% to 40%.

Figure 21:
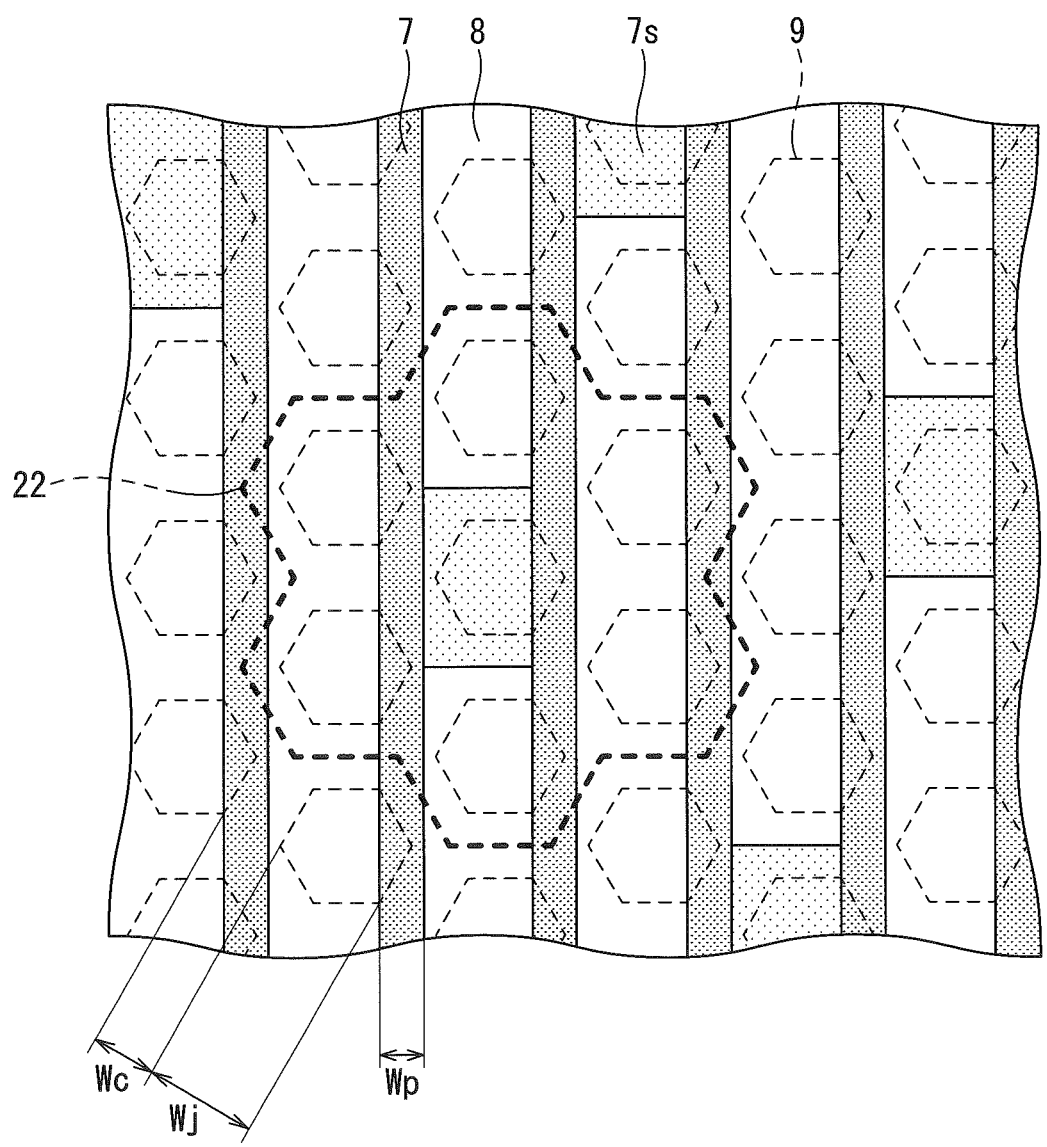
FIG. 21 is a schematic top view illustrating an example of a layout of the contact region and the trench in the insulated gate semiconductor device according to the embodiment.
Figure 22:
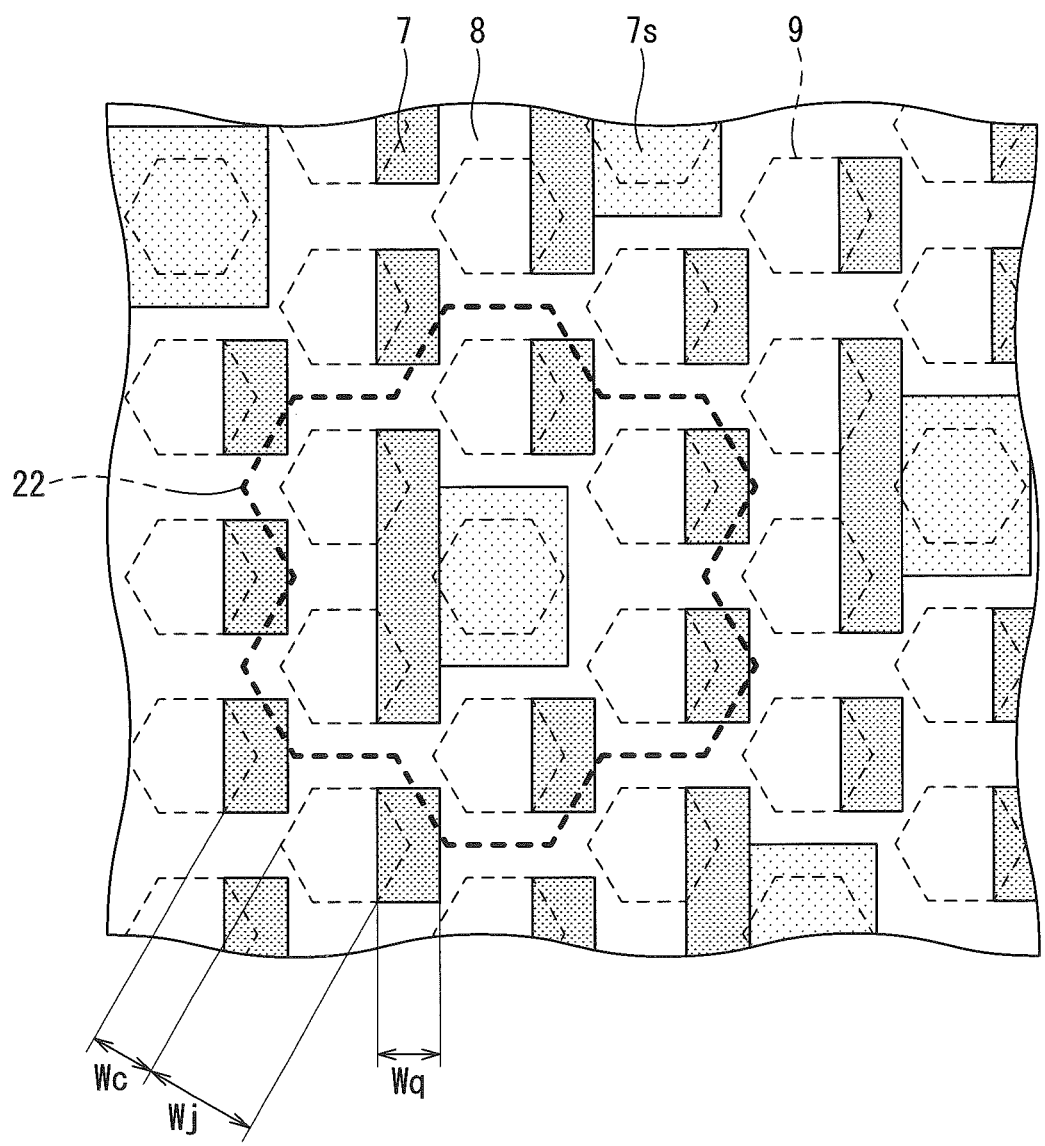
FIG. 22 is a schematic top view illustrating another example of the layout of the contact region and the trench of the insulated gate semiconductor device according to the embodiment.

FIGS. 21 and 22 are plan views illustrating layouts of the first contact regions 7 and the carrier-supply regions 8 illustrated in FIG. 16A. In FIGS. 21 and 22, a cell in which the second contact region 7s does not overlap is the first pillar, and a cell in which the second contact region 7s overlaps is the second pillar. As illustrated in FIG. 4, a width Wc of the trench 9 illustrated in FIGS. 21 and 22 is about the minimum feature size a. For example, the minimum feature size a is set to 0.7 micrometer and the JFET width Wj is set to one micrometer. In the case of the layout illustrated in FIG. 21, the stripe width Wp of the first contact region 7 is about 0.45 micrometer, which is smaller than the minimum feature size a. Therefore, as illustrated in FIG. 22, the divided first contact regions 7 are arranged. In FIG. 22, in the first pillar located between the first pillars of the adjacent columns on the right, the first contact region 7 is provided solely. In the two first pillars adjacent to the second pillars of adjacent columns on the right, the first contact region 7 is provided to be in contact with the two first pillars and simultaneously with the second base contact region 7s, and the second contact region 7s is provided on the second pillar. In the present case, the width Wq of the first contact region 7 can be set to 0.7 micrometer, which is approximately the same as the minimum feature size a.

Figure 23:
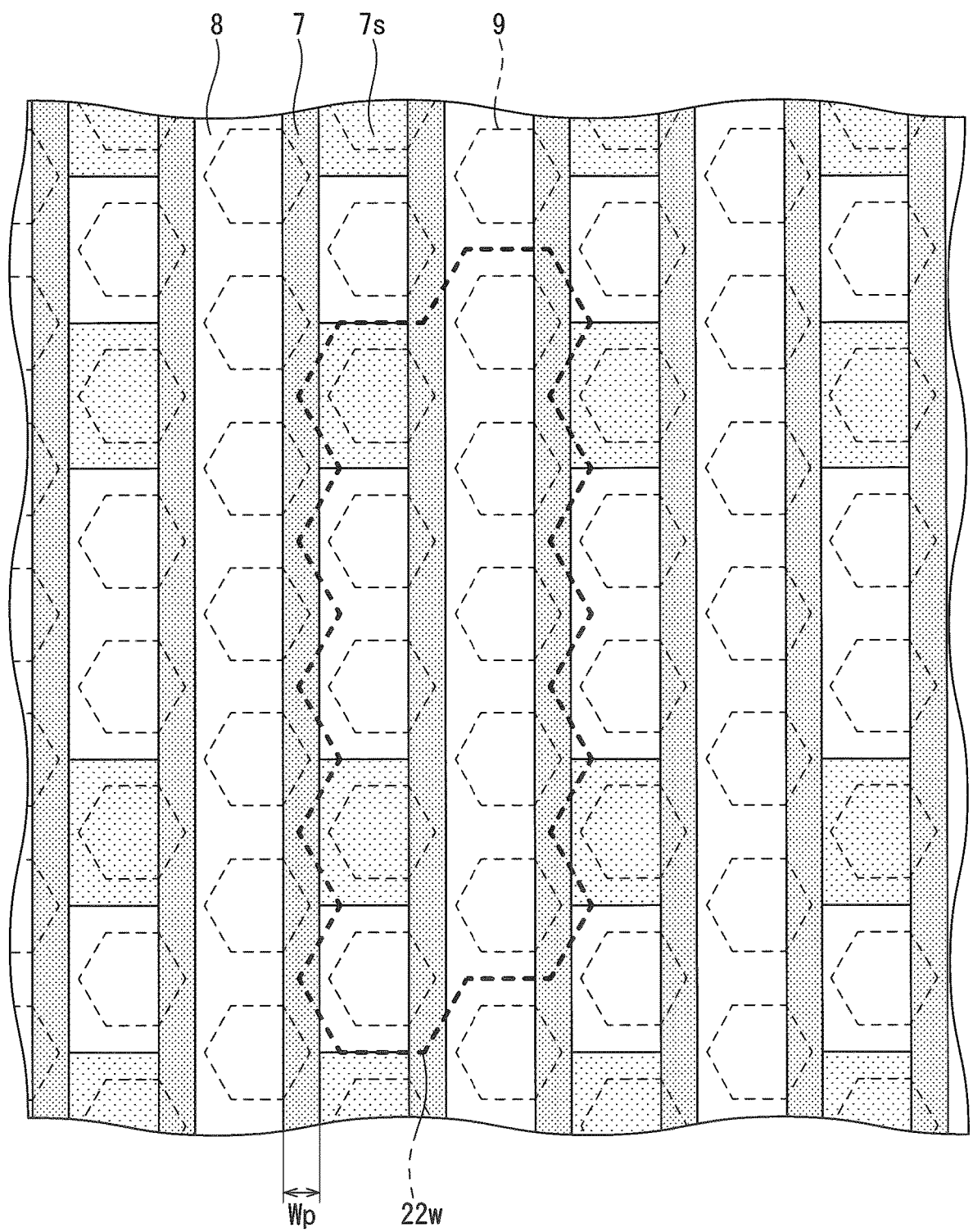
FIG. 23 is a schematic top view illustrating another example of the layout of the contact region and the trench of the insulated gate semiconductor device according to the embodiment.
Figure 24:
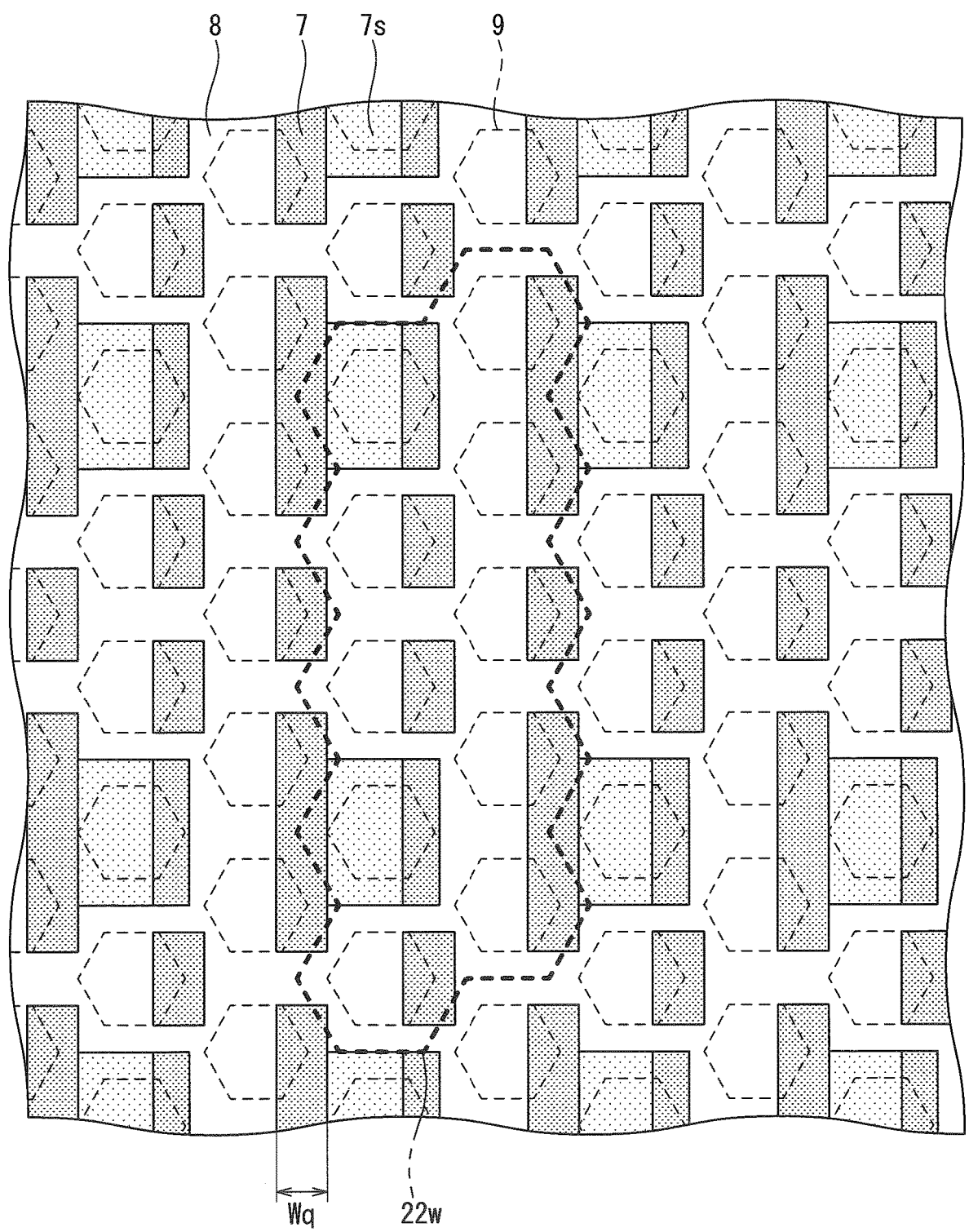
FIG. 24 is a schematic top view illustrating another example of the layout of the contact region and the trench of the insulated gate semiconductor device according to the embodiment.

FIG. 23 and FIG. 24 illustrate other examples of the cell layout, in which two second pillars and eight first pillars are arranged in the unit cell 22w. In FIGS. 23 and 24, a cell in which the second contact region 7s does not overlap is the first pillar, and a cell in which the second contact region 7s overlaps is the second pillar. The second pillars are arranged in the same column on alternate columns, alternately with one-row spacing and two-row spacing. In the other examples of the cell layout, as illustrated in FIG. 23, when the stripe-shaped first contact region 7 is used, the width Wp of the stripe is about 0.45 micrometer, which is smaller than the minimum feature size a. As illustrated in FIG. 24, when the divided first contact regions 7 are arranged, as described in FIG. 22, the width Wq of the first contact region 7 can be set to 0.7 micrometer, which is approximately the same as the minimum feature size a.

(First Modification)

Figure 25:
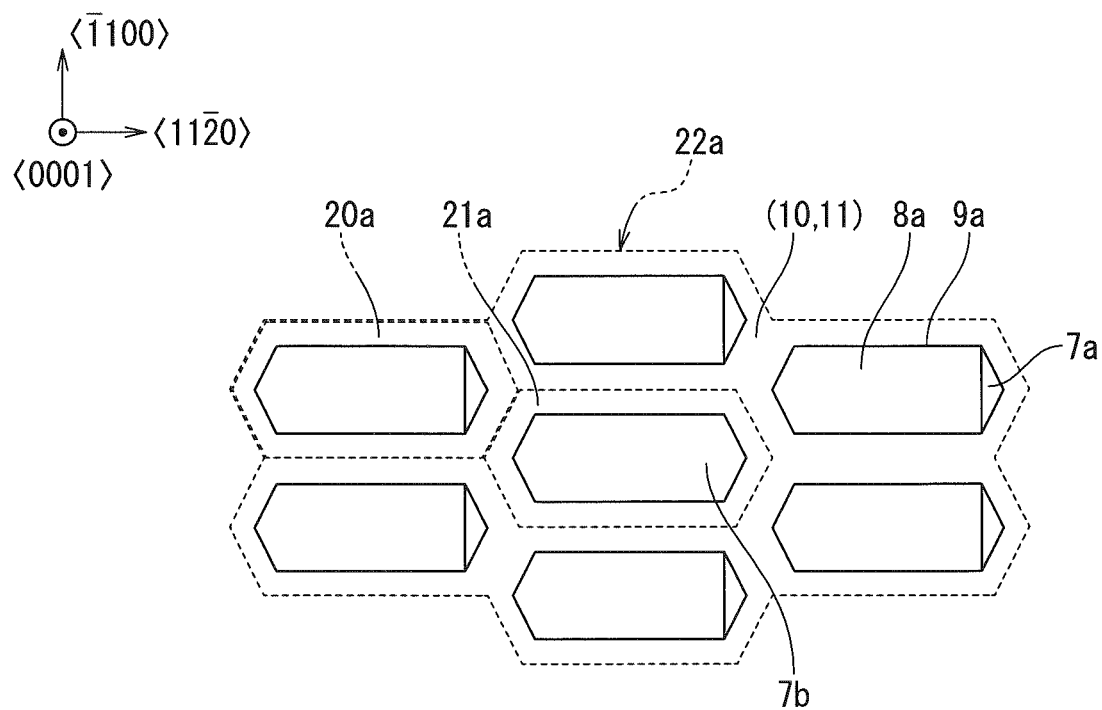
FIG. 25 is a schematic top view of a main part in a unit cell for illustrating an example of an insulated gate semiconductor device according to a first modification of the embodiment.

An insulated gate semiconductor device according to a first modification of the above-mentioned present embodiment, as illustrated in FIG. 25, is different from the present embodiment in that first pillars 20a and a second pillar 21a each having a hexagonal prism-shape with a long hexagon as a top-surface pattern, which makes a pair of parallel sides longer in the <11-20> direction, are provided in the unit cell 22a. The lateral hexagonal prism-shape, illustrating the top-surface pattern in FIG. 25, may be a three-dimensional shape similar to a hexagonal truncated pyramid surrounded by the inclined trench sidewalls. The first pillars 20a and the second pillars 21a are defined by trench 9a. Each of the first pillars 20a has a carrier-supply region 8a. Since the other configurations are the same as those of the insulated gate semiconductor device of the present embodiment, redundant description will be omitted.

In the first modification, the long sides of the long hexagon are provided in the <11-20> direction. Therefore, the total channel width per the unit cell 22a can be increased. In addition, the electron mobility of the sidewalls of the long sides of the trench 9a is larger than the disabled sidewalls. Therefore, the on-resistance can be reduced. Further, it is possible to increase the tolerance for the increase of the disable-width Wb.

Figure 26:
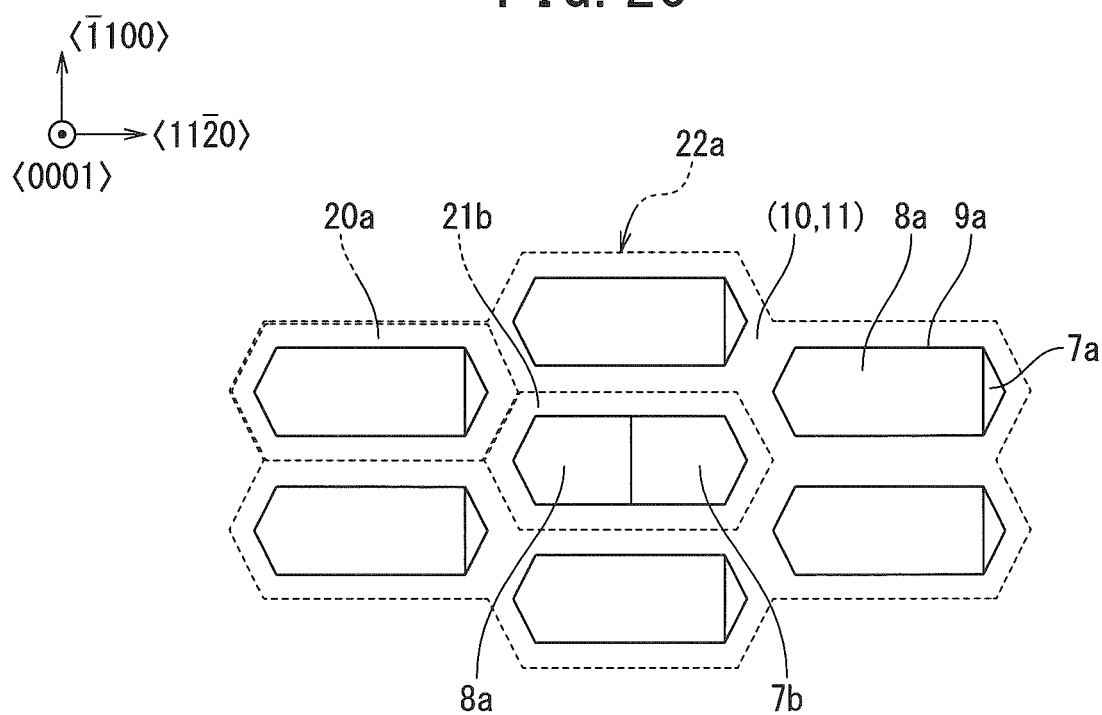
FIG. 26 is a schematic top view of a main part in a unit cell for illustrating another example of the insulated gate semiconductor device according to the first modification of the embodiment.

In addition, as illustrated in FIG. 26, in each of the contact cells of the second pillars 21b, the carrier-supply region 8a may be allocated by reducing the area of the second contact region 7b. In the present case, it is desirable to form the carrier-supply regions 8a in the second pillars 21b on the opposite side to the <11-20> direction so that the electron mobility of the sidewalls of the trench 9a may be increased. Since the channel region can also be used in the second pillars 21b, the total channel width per the unit cell 22a can be increased.

(Second Modification)

Figure 27:
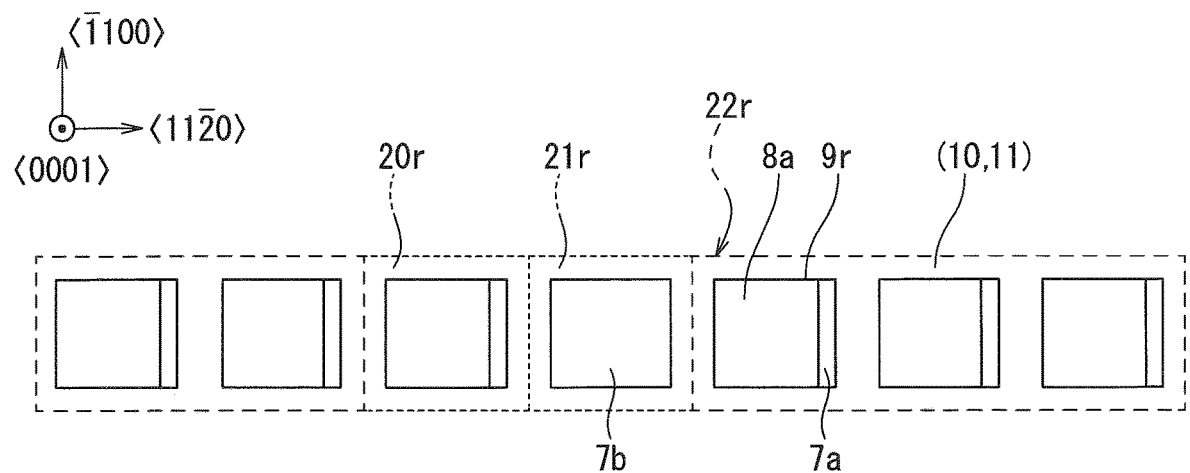
FIG. 27 is a schematic top view of a main part in a unit cell for illustrating an example of an insulated gate semiconductor device according to a second modification of the embodiment.

As illustrated in FIG. 27, an insulated gate semiconductor device according to a second modification of the present embodiment is different from the insulated gate semiconductor device of the above-mentioned present embodiment, in that a quadrangular-prism shaped first pillar 20r and a quadrangular-prism shaped second pillar 21r, arranged in one row in the <11-20> direction, are provided in a unit cell 22r. The "quadrangular prism-shape", illustrating the top-surface pattern as a rectangular-shape in FIG. 27, may also be a three-dimensional shape similar to a quadrangular truncated pyramid surrounded by the inclined trench sidewalls. The sidewalls of the trench 9r are the m-faces parallel to the <11-20> direction and the a-faces orthogonal to the <11-20> direction. As illustrated in FIG. 11, the electron mobility of the sidewall on the <11-20> direction-side is smaller. Therefore, the first contact region 7a is provided on the sidewalls facing the <11-20> direction, and the channel having a low electron mobility is disabled. Since other configurations are the same as those of the insulated gate semiconductor device of the present embodiment and the first modification, redundant description will be omitted. In the present case, the width of the first contact region 7a is preferably about 20% to about 40% of a length of one side of the cell pillar, that is, [width of the carrier-supply regions 8a]+width of the first contact region 7a.

Figure 28:
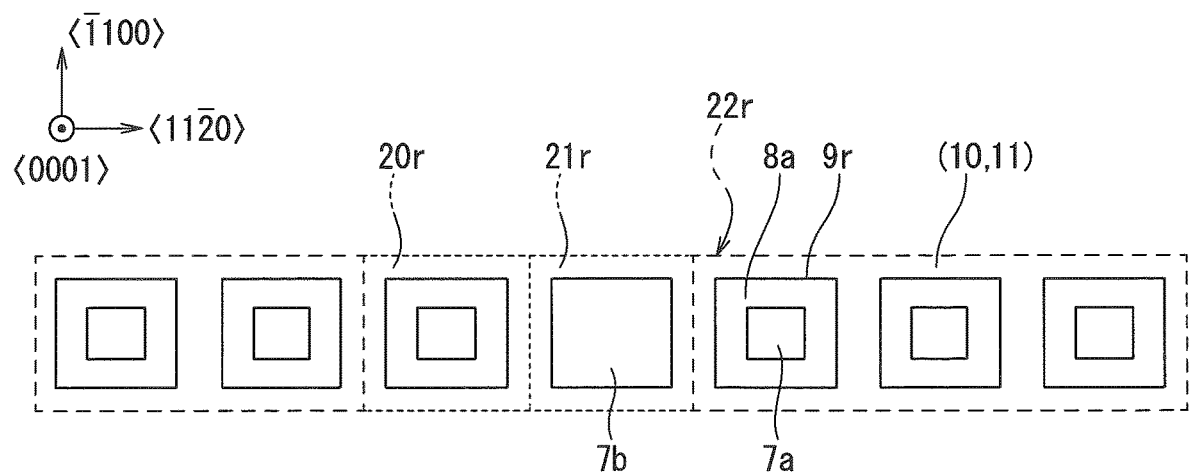
FIG. 28 is a schematic top view of a main part in a unit cell for illustrating another example of the earlier insulated gate semiconductor device.

FIG. 28 illustrates a top view of an insulated gate semiconductor device of earlier technologies when the cell structure is formed in a rectangular-shape. As illustrated in FIG. 28, in the first pillar 20r, the carrier-supply regions 8a is in contact with all the sidewalls of the trench 9r and the first contact region 7a is provided in the center part of the carrier-supply regions 8a. Therefore, as in the case of the hexagon illustrated in FIG. 6, the base-bottom buried-region is provided below the first contact region 7a. Therefore, there is no behavior of the inactivation of the channel, and the sidewalls of the trench 9r having low electron mobility are used as channels. In addition, there is an increase in the cell pitch P due to increase in the JFET width Wj, resulting in a decrease in channel density. As described above, in the process of forming the first contact region 7a, the disable-width Wb may vary due to the deviation in the mask alignment or the like. In the rectangular first pillar 20r, the optimum location for the inactivation is determined by the balance between the total channel width per the unit cell 22r and the area of the first contact region 7a. When considering processing deviation, such as the mask alignment and the like, the disable-width of the first contact region 7a needs to be 0.2 micrometer or more.

Figure 29:
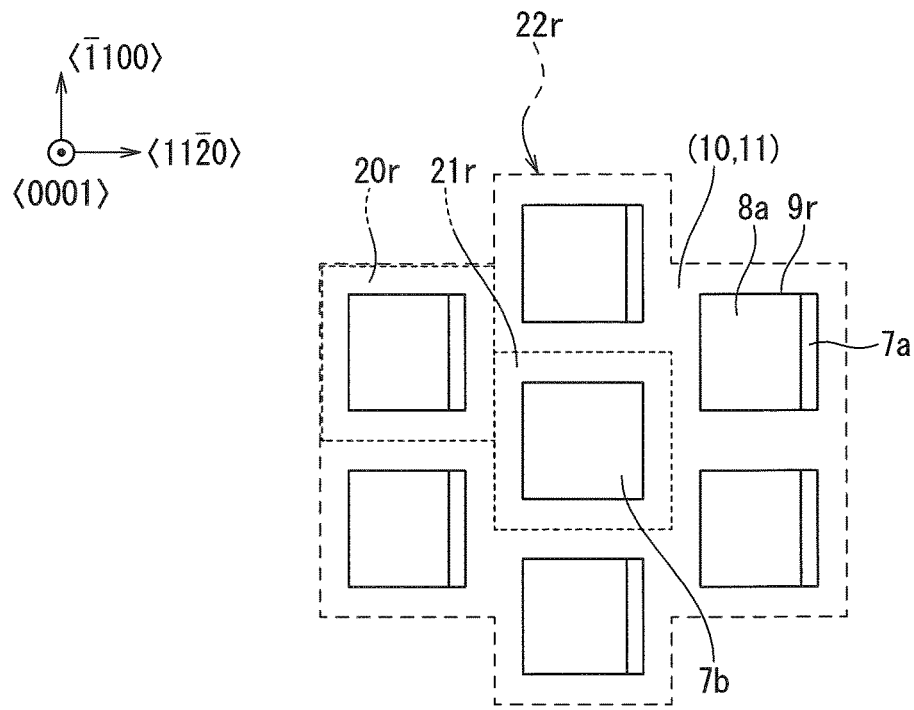
FIG. 29 is a schematic top view of a main part in a unit cell for illustrating another example of an insulated gate semiconductor device according to the second modification of the embodiment.

Note that, by using the rectangular cell structure, as illustrated in FIG. 29, the first pillars 20r may be arranged around the second pillars 21r in the periphery of the unit cell 22r. Since the distance between the second pillars 21r and each first pillars 20r may be the same, the electrical connection with the gate-bottom protection-region may be improved.

(Third Modification)

Figure 30:
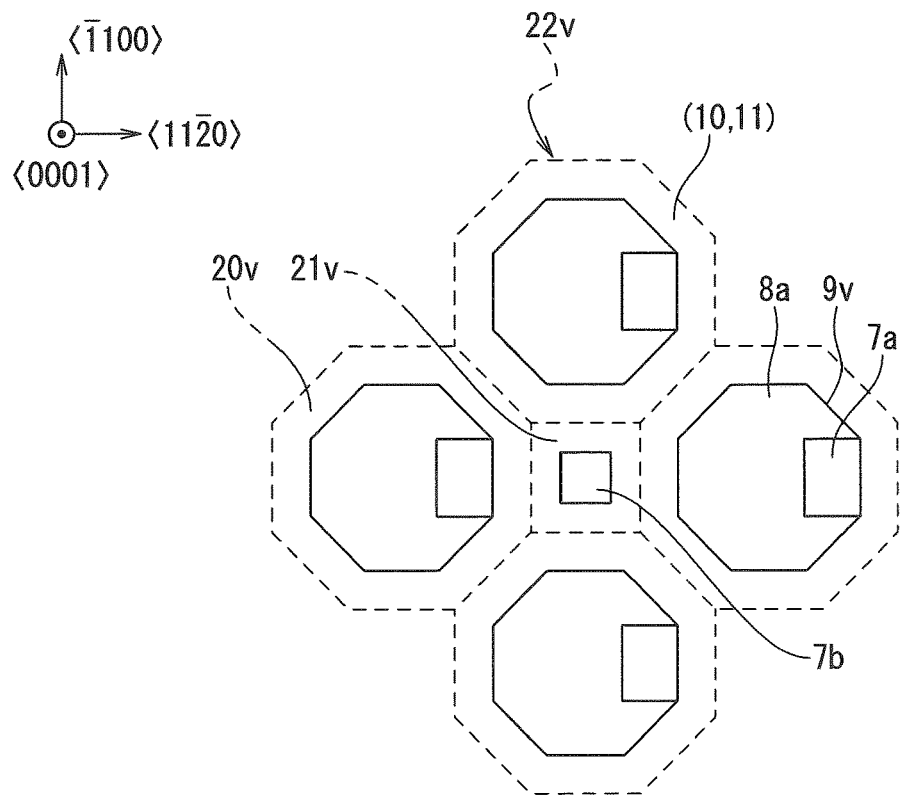
FIG. 30 is a schematic top view of a main part in a unit cell for illustrating an example of an insulated gate semiconductor device according to a third modification of the embodiment.

As illustrated in FIG. 30, an insulated gate semiconductor device according to a third modification of the present embodiment is different from the present embodiment in that octagonal prism-shaped first pillars 20v and a cubic prism-shaped second pillars 21v are provided in a unit cell 22v. The "octagonal prism-shape", illustrating the top-surface pattern as a octagon in FIG. 30, may also be a three-dimensional shape similar to an octagonal truncated pyramid surrounded by the inclined trench sidewalls. Also, the "cubic prism-shape", illustrating the top-surface pattern as a square-shape in FIG. 30, may also be a three-dimensional shape similar to a quadrangular truncated pyramid surrounded by the inclined trench sidewalls. The parallel sides to each other of the octagonal first pillars 20v are arranged parallel to the <11-20> direction. When the bottom surface of the first pillar in FIG. 30 is the (1-100) plane, the relationship between the drain current ratio and the rotation angle illustrated in FIG. 12 may be applied to the sidewalls of the trench 9v. As illustrated in FIG. 12, when the rotation angle is 90 degrees, the electron mobility becomes the lowest. Therefore, the first contact region 7a is provided on the sidewalls facing the <11-20> direction, and the channel having low mobility is disabled. Since other configurations are the same as those of the insulated gate semiconductor device of the present embodiment, and the first and second modifications, redundant description will be omitted.

Figure 31:
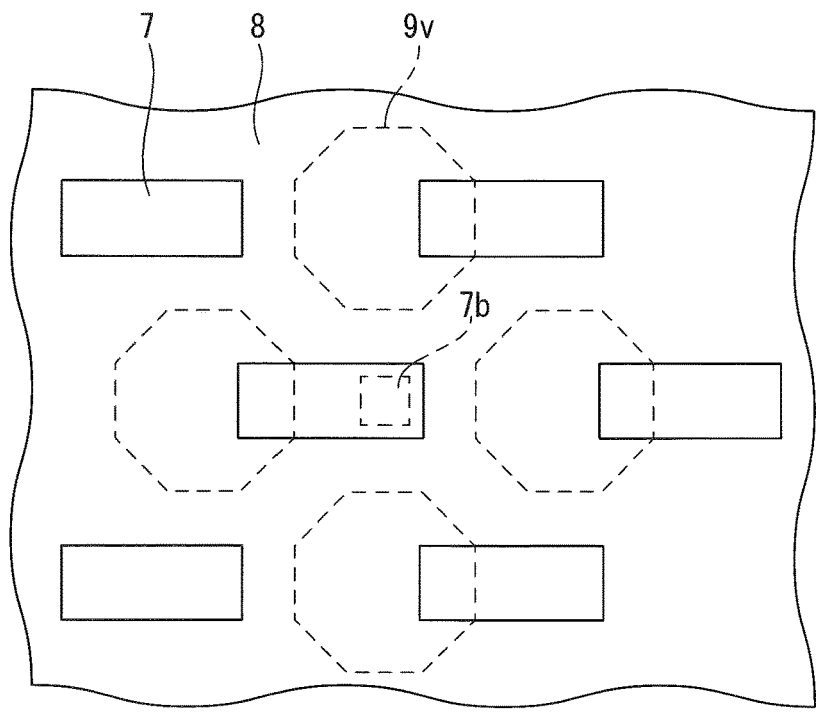
FIG. 31 is a schematic top view illustrating an example of a layout of a contact region and a trench in the insulated gate semiconductor device in FIG. 30.

FIG. 31 is a plan view illustrating the layout of the first contact region 7 and the carrier-supply regions 8. As illustrated in FIG. 31, the divided first contact regions 7 are arranged. The first contact regions 7 are arranged so as to overlap the disabled sidewalls of the trench 9v of the first pillars 20v of FIG. 30. The first contact region 7 adjacent to the second pillars 21v of FIG. 30 is arranged so as to overlap the sidewalls of the trench 9v and the second contact regions 7b.

Comparison of Embodiment and Earlier Technology

FIGS. 32 to 36 illustrate results of comparing the characteristics of the insulated gate semiconductor devices according to the present embodiment and the first to third modifications of the present embodiment, and the insulated gate semiconductor device of the earlier technology. Note that the increase in the forward voltage Vf of the body diode due to the reduction in the area of the first contact region, and the minimum feature size are not taken into consideration. For the hexagonal active cell, the structure according to the present embodiment is referred to as "hexagon-disabled-one-side", the structure according to the first modification as "long-hexagon-disabled-one-side", the structure according to the second modification as "square-disabled-one-side", the structure according to the third modification as "octagon-disabled-one-side". "Hexagon channel", "square channel", and "stripe" are denoted as earlier technologies without inactivation. As the channel density, the total channel width in the unit cell is normalized by the unit cell area. Regarding the disable-width, as illustrated in FIG. 3, for the hexagonal active cell, the position connecting the two vertexes on the side of <11-20> direction is taken as 100%. In a rectangular, or square, active cell, the position of 0.2 micrometer from the side on the <11-20> direction side is taken as 100%.

Figure 32:
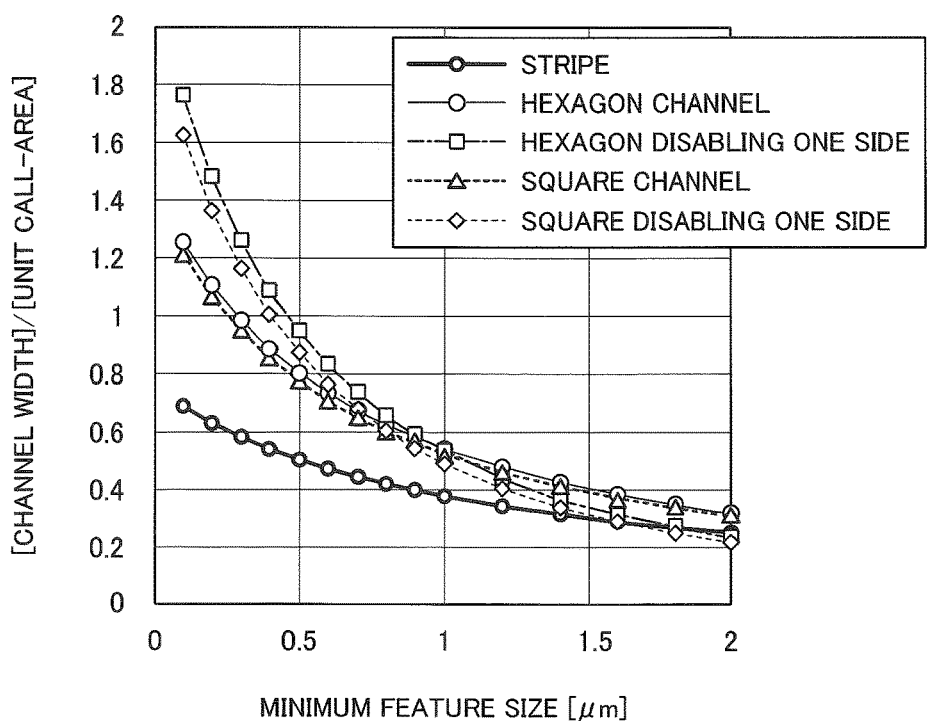
FIG. 32 is a graph illustrating examples of relationships between a value obtained by dividing a channel width by a unit cell-area and a minimum dimension of processing.
Figure 33:
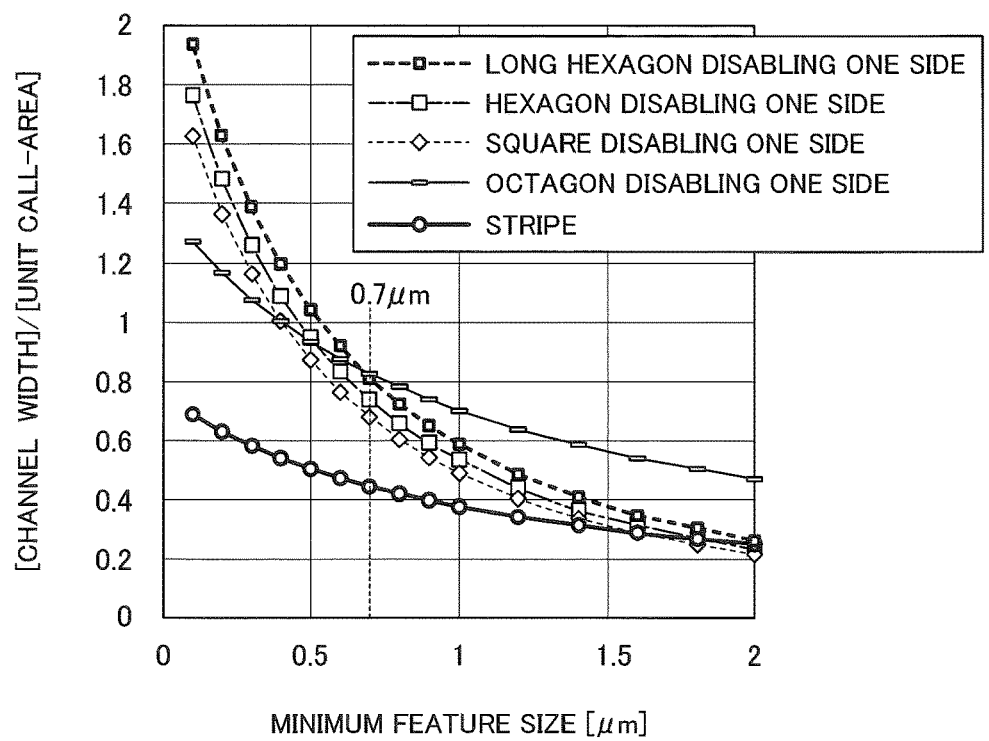
FIG. 33 is a graph illustrating other examples of relationships between the value obtained by dividing the channel width by the unit cell-area and the minimum dimension of processing.

FIGS. 32 and 33 are diagrams illustrating the results of evaluating the relationship between the channel density and the minimum feature size by fixing the JFET width at one micrometer and the disable-width at 100%. As illustrated in FIG. 32, when the minimum feature size is one micrometer or less, the channel density is increased in the hexagonal-disabled-one-side structure and the square-disabled-one-side structure, as compared with the earlier technology. Further, as illustrated in FIG. 33, in the structures according to the present embodiment and the first to third modifications, the channel density of the octagon-disabled-one-side structure is the largest when the minimum feature size is 0.7 micrometer. The long-hexagon-disabled-one-sided structure also has a channel density almost similar to that of the octagon-disabled-one-side structure.

Figure 34:
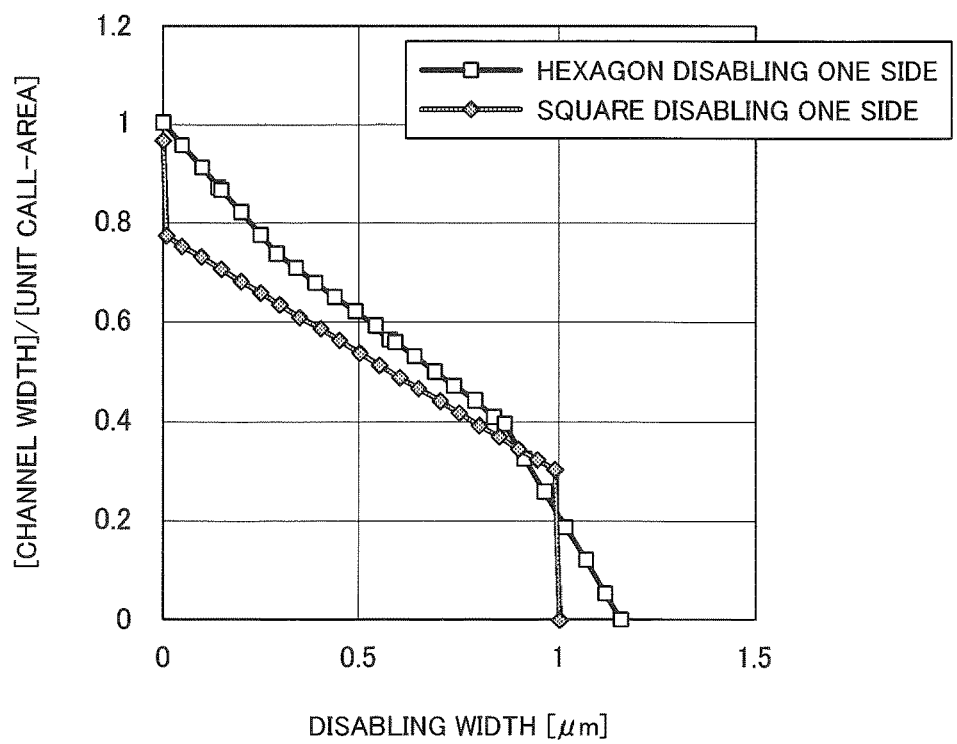
FIG. 34 is a graph illustrating examples of relationships between the value obtained by dividing the channel width by the unit cell-area and a disable-width.
Figure 35:
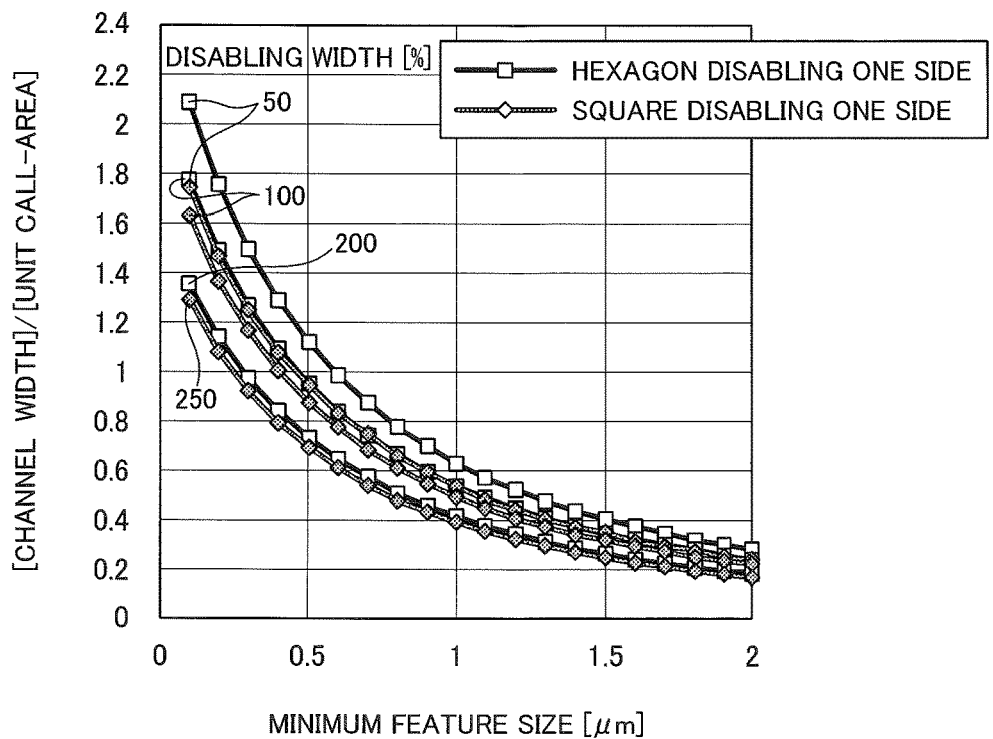
FIG. 35 is a graph illustrating examples of relationships between a value obtained by dividing a channel width by a unit cell-area and a minimum dimension of processing when the disable-width is changed.
Figure 36:
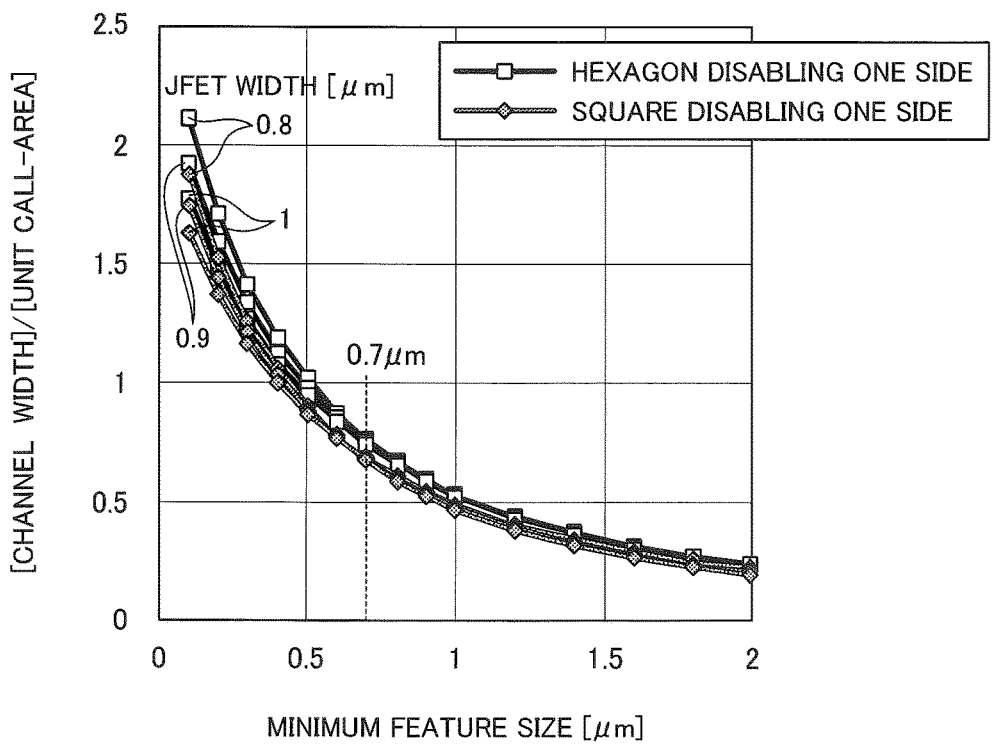
FIG. 36 is a graph illustrating examples of relationships between a value obtained by dividing a channel width by a unit cell area and a minimum dimension of processing when the JFET width is changed.

FIG. 34 illustrates the results of evaluating the relationship between the channel density and the disable-width for the structures according to the present embodiment and the second modification with the JFET width being one micrometer and the minimum feature size being 0.7 micrometer. As illustrated in FIG. 34, it is understood that the hexagon-disabled-one-side structure is more susceptible to the deviation of the pattern of the first contact region than the square-disabled-one-side structure. FIG. 35 illustrates the results of evaluating the relationship between the channel density and the minimum feature size by changing the disable-width from 50% to 250% with the JFET width set to one micrometer. As illustrated in FIG. 35, the channel density can be increased in the hexagon-disabled-one-side structure. Compared with the square-disabled-one-side structure, the hexagon-disabled-one-side structure has a large variation in channel density due to the disabled width and is easily affected by pattern deviation due to processing accuracy. In addition, FIG. 36 illustrates the results of evaluating the relationship between the channel density and the minimum feature size by changing the JFET width to 0.8 micrometer to one micrometer with the disable-width set at 100%. As illustrated in FIG. 36, the influence of the channel density due to the change in the JFET width is small until the minimum feature size is about 0.7 micrometer.

As described above, in the insulated gate semiconductor device of the present embodiment and the first to third modifications, the channel density can be increased in a range where the minimum feature size is one micrometer or less, as compared with the insulated gate semiconductor device of the earlier technology. When the pattern alignment accuracy can be secured, the shape of the active cell is preferably hexagonal rather than rectangular.

Other Embodiments

While the present invention has been described above by reference to the present embodiment and the first to the third modifications, it should be understood that the present invention is not intended to be limited to the descriptions of the specification and the drawings implementing part of this disclosure. Various alternative embodiments, examples, and technical applications will be apparent to those skilled in the art according to this disclosure.

In the insulated gate semiconductor device of the present embodiment, the trench gate MISFET is exemplified. However, the present invention is not limited to the trench gate MISFET, and may be applied to insulated gate semiconductor devices having various trenches structures, such as an IGBT having a trench structure. As the trench gate IGBT, the $n^+$-type carrier-supply regions 8a of the MISFET illustrated in FIG. 1 shall be assigned as emitter regions, and the $n^+$-type carrier-extract region 1 provided on the bottom surface of the drift layer 2 shall be assigned as a $p^+$-type collector region.

As the material for the insulated gate semiconductor device of the present embodiment, 4H—SiC is exemplified, but other hexagonal wide bandgap semiconductors, such as 6H—SiC, GaN, diamond and the like, can also be applied to the insulated gate semiconductor device of the present embodiment. Further, the insulated gate semiconductor device is not limited to the MISFET, the MISSIT, the IGBT, and the like described above. The insulated gate semiconductor device in a broad sense may also include a high electron mobility transistor (HEMT), a heterojunction FET, and the like. For example, in a heterojunction between a GaN layer and an AlN layer, an AlN layer having a wider forbidden band width can be assigned as a layer equivalent to a gate insulating film layer, and a two dimensional electron gas (2DEG) layer formed at the interface between the GaN layer and the AlN layer Layer can be induced as a channel. Likewise, in heterojunction of a ternary nitride-based compound semiconductor layer, such as InGaN/GaN, GaN/AlGaN, InGaN/AlGaN and the like, the nitride-based compound semiconductor layer having a wider forbidden band width can be assigned as an equivalent layer to a gate insulating film layer. Thus, HEMT and the like can be implemented by inducing the 2DEG layer as a channel at the heterojunction interface of a hexagonal system semiconductor material, such as a nitride-based compound semiconductor and the like, and the heterostructure formed on the inner wall of the trench es may be included in the "insulated gate type electrode structure" of the present invention. In such case, the "gate region" is the semiconductor region where the 2DEG layer is induced.

In the present embodiment and modifications, the power semiconductor device has been focused on, but the present invention is not limited to the power semiconductor device. In an insulated gate semiconductor device for a small signal other than the power semiconductor device, the configurations of the drift layer 2, the current spreading layer 3, the gate-bottom protection-regions 4a, the base-bottom buried-regions (4b, 5) and the like may be omitted. An insulated gate semiconductor device having high-speed operation and large trans-conductance gm can be realized by the structure in which the base regions 6a, 6b are in direct contact with the carrier-extract region 1. In such case, the insulating gate semiconductor device which can operate at higher speed and has large trans-conductance gm can be realized by selecting a sidewall face having a high electron mobility so as to flow a main current, while inactivating a channel region of a sidewall face having a low electron mobility. The structure in which the base regions 6a, 6b are in contact with the carrier-extract region 1 is suitable for operating an insulated gate semiconductor device having a 2DEG layer such as a nitride compound semiconductor as a channel, at a high frequency such as a submillimeter wave or the like.

As described above, it should be noted that the present invention includes various embodiments which are not disclosed herein. Therefore, the scope of the present invention is defined only by the technical features specifying the present invention, which are prescribed by claims, the words and terms in the claims shall be reasonably construed from the subject matters recited in the present Specification.

What is claimed is:

1. An insulated gate semiconductor device, comprising:
a drift layer of a first conductivity type;
a plurality of first base regions of a second conductivity type disposed on the drift layer;
a plurality of carrier-supply regions of the first conductivity type provided on the first base regions and having a higher impurity concentration than the drift layer;
a plurality of first contact regions of the second conductivity type provided on the first base regions and having a higher impurity concentration than the first base regions;
a plurality of cell-pillars each having a polygonal-shape, arranged in a lattice-pattern, sidewalls of the cell-pillars are defined by a trench penetrating a corresponding carrier-supply region, first contact region, and first base region; and
an insulated-gate electrode-structure provided in the trench,
wherein
each of first pillars from among the cell-pillars includes a carrier-supply region, a first contact region, and a first base region,
each of the first contact regions is in contact with a limited portion of an outer periphery of a corresponding first pillar at a top surface of the corresponding first pillar, and
wherein
each top surface of the cell-pillars has an off-angle of two degrees or more and eight degrees or less in the <11-20> direction with respect to the <0001> direction, or
each cross-sectional shape perpendicular to height directions of the cell-pillars on the top surface is a hexagon and a pair of parallel sides of the hexagon extend in a <11-20> direction.

2. The semiconductor device of claim 1, wherein
each cross-sectional shape perpendicular to height directions of the cell-pillars on the top surface is the hexagon and the pair of parallel sides of the hexagon extend in a <11-20> direction, and
each of the first contact regions is provided in contact with the (1-100) plane of the cell-pillars, or
each of the first contact regions of the cell-pillars is arranged on a line extending in a <1-100> direction on a principal surface of the drift layer.

3. An insulated gate semiconductor device, comprising:
a drift layer of a first conductivity type;
a plurality of first base regions of a second conductivity type disposed on the drift layer;
a plurality of carrier-supply regions of the first conductivity type provided on the first base regions and having a higher impurity concentration than the drift layer;
a plurality of first contact regions of the second conductivity type provided on the first base regions and having a higher impurity concentration than the first base regions;
a plurality of cell-pillars each having a polygonal-shape, arranged in a lattice-pattern, sidewalls of the cell-pillars are defined by a trench penetrating a corresponding carrier-supply region, first contact region, and first base region, the plurality of cell-pillars including first pillars and a second pillar, wherein
each of the first pillars includes a carrier-supply region, a first contact region and a first base region,
each of the first contact regions is in contact with a limited portion of an outer periphery of a corresponding first pillar at a top surface of the corresponding first pillar, and
the second pillar includes a second base region and a second contact region provided on the second base region and in contact with an outer periphery of a top surface of the second pillar;
an insulated-gate electrode-structure provided in the trench;
gate-bottom protection-regions of the second conductivity type having a higher impurity concentration than the first base region, buried to be in contact with a bottom of the trench; and
a base-bottom buried-region provided at the bottom of the second base region, configured to provide a conductive path for electrically connecting the second contact region and a part of the gate-bottom protection-regions.

4. The insulated gate semiconductor device of claim 3, wherein the second contact region is in contact with an entire outer periphery of the second pillar.

5. An insulated gate semiconductor device, comprising:
a drift layer of a first conductivity type;
a plurality of first base regions of a second conductivity type disposed on the drift layer;

a plurality of carrier-supply regions of the first conductivity type provided on the first base regions and having a higher impurity concentration than the drift layer;

a plurality of first contact regions of the second conductivity type provided on the first base regions and having a higher impurity concentration than the first base regions;

a plurality of cell-pillars each having a polygonal-shape, arranged in a lattice-pattern, sidewalls of the cell-pillars are defined by a trench penetrating a corresponding carrier-supply region, first contact region, and first base region; and an insulated-gate electrode-structure provided in the trench, wherein each of first pillars from among the cell-pillars includes a carrier-supply region, a first contact region, and a first base region, for each of the first pillars, the carrier-supply region is in contact with the insulated-gate electrode-structure of the trench and the first contact region is in contact with another insulated-gate electrode-structure of another trench adjacent to the trench, a second pillar from among the cell-pillars includes a second base region and a second contact region provided on the second base region, the second contact region not being in contact with a carrier-supply region, and each of the first contact regions is in contact with a limited portion of an outer periphery of a corresponding first pillar at a top surface of the corresponding first pillar.

6. The insulated gate semiconductor device of claim 5, wherein at a top surface of the first pillar, an outer periphery of the first pillar is in contact with a corresponding carrier-supply region except the limited portion being contacted with a corresponding first contact region, in each of the first pillars.

7. The insulated gate semiconductor device of claim 5, wherein the lattice-pattern is established so that straight lines connecting the centers of the cell-pillars intersects with regularity.

8. The insulated gate semiconductor device of claim 5, wherein each cross-sectional shape perpendicular to height directions of the cell-pillars is any one of a rectangular-shape, a hexagonal-shape and an octagonal-shape.

9. The semiconductor device of claim 5, wherein the plurality of first contact regions and the plurality of carrier-supply regions extend to a same depth with respect to the first base regions.

10. The semiconductor device of claim 5, further comprising gate-bottom protection-regions of the second conductivity type having a higher impurity concentration than the first base region, buried to be in contact with a bottom of the trench.

11. The semiconductor device of claim 10, wherein the second contact region is in contact with an outer periphery of a top surface of the second pillar, and the insulated gate semiconductor device further comprises a base-bottom buried-region provided at the bottom of the second base region, configured to provide a conductive path for electrically connecting the second contact region and a part of the gate-bottom protection-regions.

12. The insulated gate semiconductor device of claim 5, wherein each top surface of the cell-pillars has an off-angle of two degrees or more and eight degrees or less in the <11-20> direction with respect to the <0001> direction, or each cross-sectional shape perpendicular to height directions of the cell-pillars on the top surface is a hexagon and a pair of parallel sides of the hexagon extend in a <11-20> direction.

13. The insulated gate semiconductor device of claim 12, wherein each cross-sectional shape perpendicular to height directions of the cell-pillars on the top surface is the hexagon and the pair of parallel sides of the hexagon extend in a <11-20> direction, and each of the first contact regions is provided in contact with the (1-100) plane of the cell-pillars.

14. The insulated gate of claim 12, wherein each cross-sectional shape perpendicular to height directions of the cell-pillars on the top surface is the hexagon and the pair of parallel sides of the hexagon extend in a <11-20> direction, and each of the first contact regions of the cell-pillars is arranged on a line extending in a <1-100> direction on a principal surface of the drift layer.

15. A method for manufacturing an insulated gate semiconductor device, comprising:

forming a plurality of gate-bottom protection-regions of a second conductivity type on a top surface of a drift layer of a first conductivity type; and selectively forming a base-bottom buried-region on a selected portion of the gate-bottom protection-regions;

growing a base region on the drift layer and on a top surface of the base-bottom buried-region, the base region having a second conductivity type and having an impurity concentration lower than the plurality of gate-bottom protection-regions;

selectively forming a plurality of carrier-supply regions of the first conductivity type having a higher impurity concentration than the drift layer in an upper portion of the base region;

selectively forming a plurality of first contact regions of the second conductivity type having a higher impurity concentration than the base region in a selected upper portion of the base region;

selectively forming a second contact region of the second conductivity type having a higher impurity concentration than the base region, in another selected upper portion of the base region;

digging a trench penetrating a corresponding carrier-supply region, first contact region, and portion of the base region disposed below the corresponding carrier-supply region to define a plurality of polygonal cell-pillars arranged in a lattice-pattern, such that a top surface of a corresponding gate-bottom protection region among the plurality of gate-bottom protection regions is exposed at a bottom of the trench; and forming an insulated-gate electrode-structure having a gate insulating film and a gate electrode on an inside of the trench, the another selected upper portion is allocated at a specified portion such that a conductive path for electrically connecting the second contact region and the gate-bottom protection-regions can be provided.

16. The method of claim 15, wherein a second pillar from among the cell-pillars includes the second contact region such that the second contact region is in contact with an entire outer periphery of the second pillar.

17. A method for manufacturing an insulated gate semiconductor device, comprising:

growing a base region on a top surface of a drift layer of a first conductivity type, the base region having a second conductivity type;

selectively forming a plurality of carrier-supply regions of the first conductivity type having a higher impurity concentration than the drift layer in an upper portion of the base region;

selectively forming a plurality of first contact regions and a second contact region of the second conductivity type having a higher impurity concentration than the base region in a selected upper portion of the base region;

digging trenches penetrating at least one of a corresponding carrier-supply region, first contact region, second contact region, and portions of the base region disposed below the corresponding carrier-supply region, first contact region, and second contact region, to define a plurality of polygonal cell-pillars arranged in a lattice-pattern; and forming an insulated-gate electrode-structure having a gate insulating film and a gate electrode on an inside of a trench among the trenches, wherein each of first pillars from among the cell-pillars includes a carrier-supply region, a first contact region, and a portion of the base region disposed below the carrier-supply region, for each of the first pillars the carrier-supply region is in contact with the insulated-gate electrode-structure of the trench and the first contact region is in contact with another insulated-gate electrode-structure of another trench adjacent to the trench, a second pillar from among the cell-pillars includes the second contact region and a portion of the base region which is disposed below the second contact region, the second contact region not being in contact with a carrier-supply region, and in each of the first pillars, a corresponding first contact region is in contact with a limited portion of an outer periphery of a corresponding first pillar at a top surface of the corresponding first pillar.

18. The method of claim 17, wherein in an upper portion of the first pillar, a corresponding carrier-supply region is arranged so that, except for the limited portion of the outer periphery of the first pillar, the corresponding carrier-supply region can be contacted with the outer periphery of the first pillar, in each of the first pillars.

19. The method of claim 17, further comprising forming a plurality of gate-bottom protection-regions of the second conductivity type having a higher impurity concentration than the base region, configured to be buried at respective portions to be in contact with a bottom of the trench.

20. The method of claim 17, wherein the first contact region is formed in a stripe-shape.

* * * * *

UNITED STATES PATENT AND TRADEMARK OFFICE
CERTIFICATE OF CORRECTION

PATENT NO. : 11,004,936 B2
APPLICATION NO. : 16/397380
DATED : May 11, 2021
INVENTOR(S) : Syunki Narita Page 1 of 1

It is certified that error appears in the above-identified patent and that said Letters Patent is hereby corrected as shown below:

In the Claims

Column 24, Line 64:
In Claim 15, before "the another" insert -- wherein --.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*